United States Patent
Maejima

(10) Patent No.: US 8,605,487 B2
(45) Date of Patent: *Dec. 10, 2013

(54) SEMICONDUCTOR STORAGE DEVICE

(71) Applicant: Kabushiki Kaisha Toshiba, Minato-ku (JP)

(72) Inventor: Hiroshi Maejima, Chigasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/765,174

(22) Filed: Feb. 12, 2013

(65) Prior Publication Data

US 2013/0155750 A1 Jun. 20, 2013

Related U.S. Application Data

(63) Continuation of application No. 13/237,405, filed on Sep. 20, 2011, now Pat. No. 8,385,104, which is a continuation of application No. 12/553,516, filed on Sep. 3, 2009, now Pat. No. 8,040,709.

(30) Foreign Application Priority Data

Oct. 23, 2008 (JP) ................................. 2008-273447

(51) Int. Cl.
  *G11C 11/00* (2006.01)
(52) U.S. Cl.
  USPC ........................................................ 365/148

(58) Field of Classification Search
  USPC ........................................................ 365/148
  See application file for complete search history.

(56) References Cited

U.S. PATENT DOCUMENTS

| 5,517,450 | A | 5/1996 | Ohsawa |
| 7,345,916 | B2 | 3/2008 | Yang et al. |
| 7,561,464 | B2 | 7/2009 | Toda |
| 8,040,709 | B2 * | 10/2011 | Maejima .......................... 365/51 |
| 8,385,104 | B2 * | 2/2013 | Maejima ........................ 365/148 |
| 2007/0195590 | A1 * | 8/2007 | Sugita ............................. 365/163 |
| 2009/0122598 | A1 | 5/2009 | Toda et al. |
| 2009/0196116 | A1 | 8/2009 | Oh |
| 2010/0067279 | A1 | 3/2010 | Choi |

\* cited by examiner

*Primary Examiner* — Huan Hoang
*Assistant Examiner* — Min Huang
(74) *Attorney, Agent, or Firm* — Oblon, Spivak, McClelland, Maier & Neustadt, L.L.P.

(57) ABSTRACT

A semiconductor storage device includes: a memory cell array having memory cells positioned at respective intersections between a plurality of first wirings and a plurality of second wirings, each of the memory cells having a rectifier element and a variable resistance element connected in series; and a control circuit selectively driving the first and second wirings. The plurality of first wirings that are specified and selectively driven at the same time by one of a plurality of address signals are separately arranged with other first wirings interposed therebetween within the memory cell array when a certain potential difference is applied to a selected memory cell positioned at an intersection between the first and second wirings by the control circuit.

28 Claims, 12 Drawing Sheets

VRow Driver 13

Column Switch 20

ONLY SELECTED BIT LINE BL IS SET AT VRESET, OTHER NONSELECTED BIT LINES BL ARE SET AT 0V

Column decoder 21

Sense Amp & Write Buffer 22

VCol Driver 23

SEMICONDUCTOR STORAGE DEVICE

CROSS REFERENCE TO RELATED APPLICATIONS

This application is a continuation of U.S. application Ser. No. 13/237,405 filed Sep. 20, 2011, which is a continuation of U.S. application Ser. No. 12/553,516 filed Sep. 3, 2009, and is based on and claims the benefit of priority from prior Japanese Patent Application No.2008-273447, filed on Oct. 23, 2008, the entire contents of each of which are incorporated herein by reference.

BACKGROUND OF THE INVENTION

1. Field of the Invention

The present invention relates to a semiconductor storage device, and in particular, to a semiconductor storage device with a structure where memory cell arrays are laminated on the semiconductor substrate.

2. Description of the Related Art

Resistive memory has attracted increased attention as a likely candidate for replacing flash memory. As described herein, it is assumed that the resistive memory devices include Resistive RAM (ReRAM), in a narrow sense, that uses a transition metal oxide as a recording layer and stores its resistance states in a non-volatile manner, as well as Phase Change RAM (PCRAM) that uses chalcogenide, etc., as a recording layer to utilize the resistance information of crystalline states (conductors) and amorphous states (insulators).

It is known that the variable resistance elements in resistive memory have two modes of operation. One is to set a high resistance state and a low resistance state by switching the polarity of the applied voltage, which is referred to as "bipolar type". The other enables the setting of a high resistance state and a low resistance state by controlling the voltage values and the voltage application time, without switching the polarity of the applied voltage, which is referred to as "unipolar type".

To achieve high-density memory cell arrays, the unipolar type is preferable. This is because that the unipolar type solution enables, without transistors, cell arrays to be configured by superposing variable resistance elements and rectifier elements, such as diodes, on respective intersections between bit lines and word lines. Moreover, large capacity may be achieved without an increase in cell array area by arranging such memory cell arrays laminated in a three-dimensional manner (see, Japanese Unexamined Patent Publication No. (Kohyo) 2005-522045).

Performing setting operation for writing data to, reset operation for erasing data from, and read operation to reading data from a memory cell array provided on the semiconductor substrate involves a certain amount of processing time. To improve the processing speed of the resistive memory device during the set, reset, and read operations, a larger number of memory cells need to be operated at the same time in the corresponding memory cell array. However, as the number of memory cells operated at the same time increases, a larger voltage drop is caused due to the parasitic resistance of wirings in the memory cell array. This voltage drop may prevent a sufficient voltage/current from being applied to the memory cell, which could result in failure of operations to be performed on a desired memory cell.

SUMMARY OF THE INVENTION

One aspect of the present invention provides a semiconductor storage device comprising: a memory cell array having memory cells positioned at respective intersections between a plurality of first wirings and a plurality of second wirings, each of the memory cells having a rectifier element and a variable resistance element connected in series; and a control circuit selectively driving the first and second wirings, in applying, by the control circuit, a certain potential difference to a selected memory cell positioned at an intersection between the first and second wirings, the plurality of first wirings specified and selectively driven at the same time by one of a plurality of address signals being separately arranged with other first wirings interposed therebetween within the memory cell array.

Another aspect of the present invention provides a semiconductor storage device comprising: a memory cell array having memory cells positioned at respective intersections between a plurality of first wirings and a plurality of second wirings, each of the memory cells having a rectifier element and a variable resistance element connected in series; and a control circuit selectively driving the first and second wirings, in applying, by the control circuit, a first voltage to the first wirings and a second voltage lower than the first voltage to the second wirings to apply a certain potential difference to a selected memory cell positioned at an intersection between the first and second wirings, the plurality of first wirings specified and selectively driven at the same time by one of a plurality of address signals being separately arranged with other first wirings interposed therebetween within the memory cell array.

Still another aspect of the present invention provides a semiconductor storage device comprising: a memory cell array having memory cells positioned at respective intersections between a plurality of first wirings and a plurality of second wirings, each of the memory cells having a rectifier element and a variable resistance element connected in series; and a control circuit selectively driving the first and second wirings, in applying, by the control circuit, a certain potential difference to a selected memory cell positioned at an intersection between multiple ones of the first wirings and one of the second wirings, the plurality of memory cells connected to one of the second wirings, on which memory cells operations are performed simultaneously, being separately arranged with other memory cells interposed therebetween in a direction in which the second wiring extends.

DETAILED DESCRIPTION OF THE EMBODIMENTS

Embodiments of the present invention will now be described below with reference to the accompanying drawings. In the disclosed embodiments, a semiconductor storage device is described as a resistive memory device having a three-dimensional memory cell array structure with laminated memory cell arrays. Of course, this configuration, however, is intended to be exemplary only, and not a limitation upon the present invention.

[First Embodiment]

Figure 1:
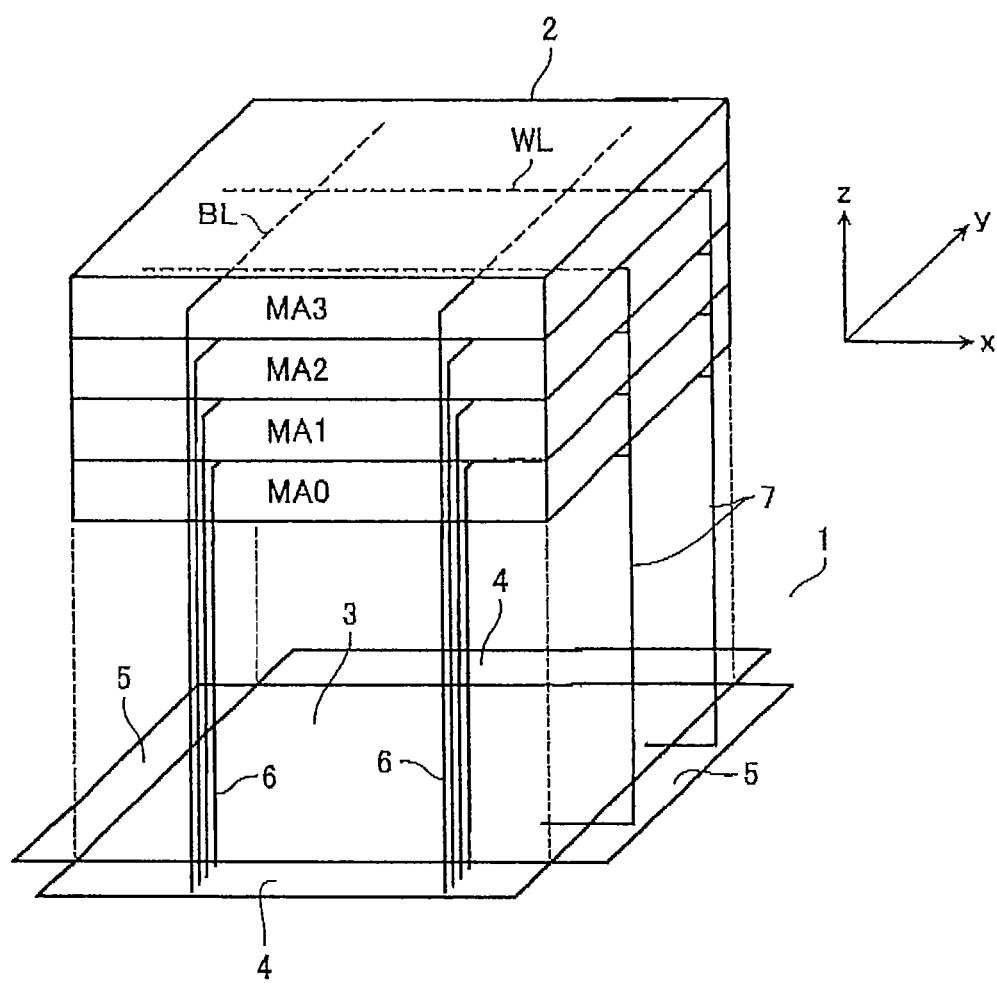
FIG. 1 is a perspective view illustrating a configuration of a resistive memory device according to a first embodiment.

FIG. 1 illustrates a basic configuration of a resistive memory device according to an embodiment of the present invention, i.e., configuration of a wiring region 3, in which wirings such as global buses are formed on a semiconductor substrate 1, and a memory block 2 laminated thereon.

In the case of FIG. 1, the memory block 2 includes four layers of memory cell arrays MA0 to MA3. The wiring region 3 is provided on the semiconductor substrate 1 immediately below the memory block 2. The wiring region 3 has, for example, global buses provided thereon for communicating data written to and read from the memory block 2 with the external. As described below, a column control circuit including a column switch, etc., and a row control circuit including a row decoder, etc., may also be provided on the wiring region 3.

It is necessary to provide vertical wirings (via contacts) on the side surface of the memory block 2 for connecting word lines WL and bit lines BL of the laminated memory cell arrays MA to the wiring region 3 formed on the semiconductor substrate 1. The wiring region 3 has bit-line contact regions 4 and word-line contact regions 5 provided on its four sides. The bit-line contact regions 4 and the word-line contact regions 5 have bit-line contacts 6 and word-line contacts 7 formed therein for connecting the bit lines BL and the word lines WL to the control circuits. Each of the word lines WL is connected to the wiring region 3 via a respective word-line contact 7, one end of which is formed on one of the word-line contact regions 5. In addition, each of the bit lines BL is connected to the wiring region 3 via a respective bit-line contact 6, one end of which is formed on one of the bit-line contact regions 4.

Although FIG. 1 illustrates one memory block 2 with multiple memory cell arrays MA laminated therein in a direction perpendicular to the semiconductor substrate 1 (the z direction of FIG. 1), a plurality of such memory blocks 2 are, in fact, arranged in a matrix form in a longitudinal direction to the word lines WL (the x direction of FIG. 1) as well as in another longitudinal direction to the bit lines BL (the y direction of FIG. 1).

As illustrated in FIG. 1, in the one word-line contact region 5 according to this embodiment, only one line of contacts, i.e., those word lines WL in all layers of one cross section are connected to the wiring region 3 via respective common contacts. In addition, in the one bit-line contact region 4, the bit lines BL in each layer are connected to the wiring region 3 via four lines of contacts separately prepared for each layer. Although the bit lines BL are independently driven for each layer and the word lines WL are connected in common in all layers in this embodiment, the word lines WL may also be independently driven for each layer. Alternatively, the bit lines BL may also be connected in common and the word lines WL may be independently driven. Moreover, at least one of the bit lines BL and the word lines WL may be configured to be shared between the upper and lower layers.

Figure 2:
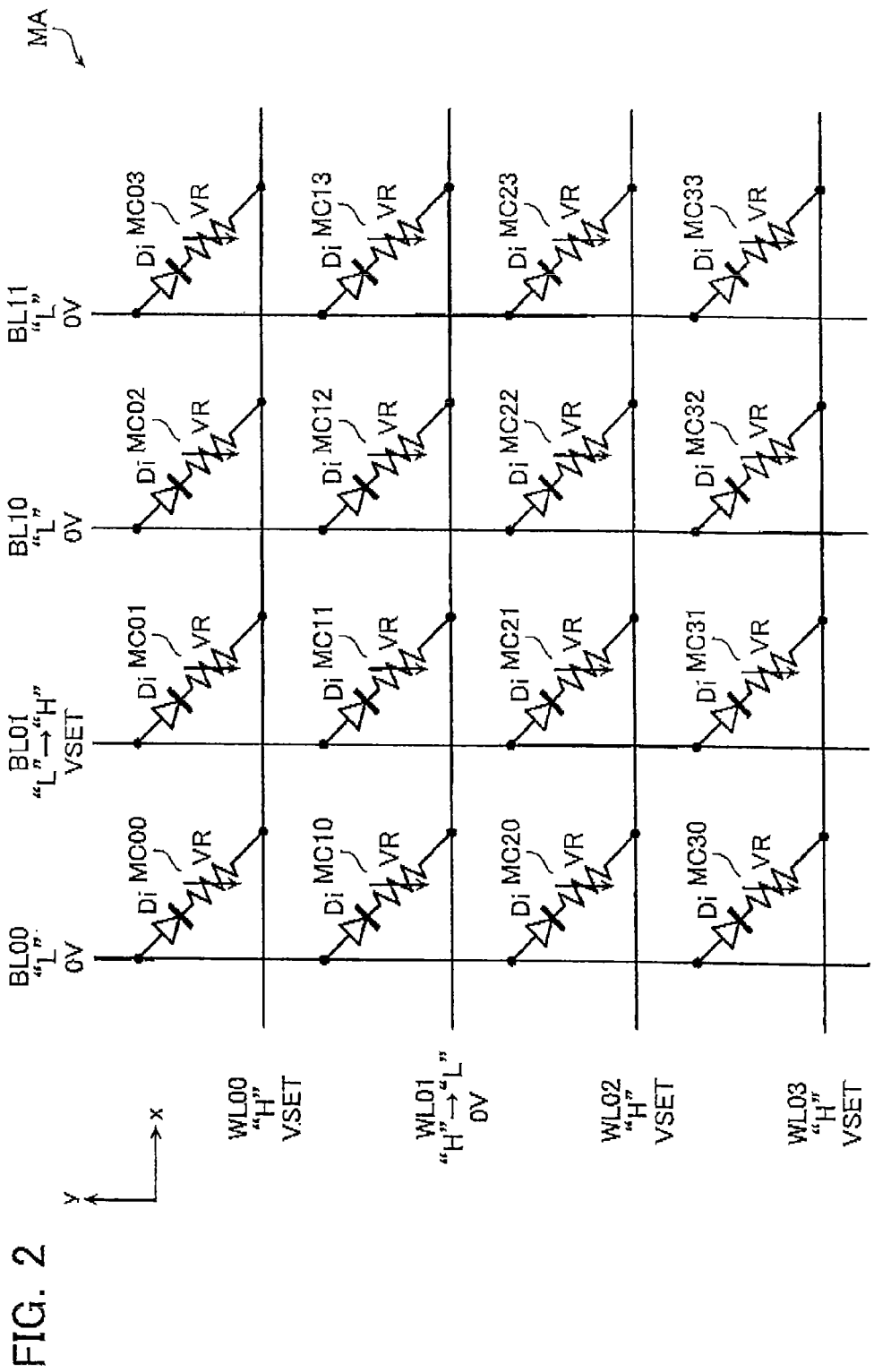
FIG. 2 is an equivalent circuit diagram of a memory cell array in the resistive memory device according to the first embodiment.

FIG. 2 is an equivalent circuit diagram of a memory cell array MA in the resistive memory device. In this case, the memory cell array MA illustrated in FIG. 2 has a plurality of unit memory cells MC arranged in a longitudinal direction to the bit lines BL (the y direction of FIG. 2) as well as in another longitudinal direction to the word lines WL (the x direction of FIG. 2), respectively, in a two dimensional matrix form. As can be seen, resistance-varying type unit memory cells MC are positioned at intersections between word lines WL and bit lines BL, with rectifier elements, e.g., diodes Di, and variable resistance elements VR connected in series. It should be noted that the arrangement and polarity of the diodes Di and the variable resistance elements VR included in the memory cells MC are not limited to the illustrated ones.

The variable resistance elements VR, which have, for example, a structure of electrode/transition metal oxide/electrode, provide a change in resistance value of metal oxide depending on the conditions of applied voltage, current, heat, etc., and store the different states of the resistance values as information in a non-volatile manner. More specifically, the following can be used as the variable resistance elements VR: changing resistance values with a phase transition between a crystalline state and an amorphous state, such as chalcogenide (PCRAM); changing resistance values by depositing metal cations to form a contacting bridge between electrodes, or ionizing the deposited metal to break down the contacting bridge (CBRAM: Conductive Bridging RAM); changing resistance values through application of voltage or current (ReRAM) (which is divided broadly into two types: one is the type where a resistance change occurs depending on the absence of presence of charges trapped by a charge trapping residing on the electrode interface; and the other is the type where a resistance change occurs depending on the absence or presence of a conductive path due to oxygen defect, etc.); and so on.

For unipolar-type ReRAM, data is written to a memory cell MC by applying, for on the order of 10 ns to 100 ns, a voltage of, e.g., 3.5V (in fact, on the order of 4.5V if a voltage drop in the corresponding diode Di is included) and a current of on the order of 10 nA to a variable resistance element VR. As a result, the variable resistance element VR changes from a high resistance state to a low resistance state. The operation of changing a variable resistance element VR from a high resistance state to a low resistance state is hereinafter referred to as the "setting operation".

On the other hand, data is erased from a memory cell MC by applying, for on the order of 500 ns to 2 μs, a voltage of 0.8V (in fact, on the order of 1.8V if a voltage drop in the corresponding diode Di is included) and a current of on the order of 1 μA to 10 μA to a variable resistance element VR in its low resistance state after the setting operation. As a result, the variable resistance element VR changes from a low resistance state to a high resistance state. The operation of changing a variable resistance element VR from a low resistance state to a high resistance state is hereinafter referred to as the "reset operation".

For example, memory cell MC takes a high resistance state as a stable state (reset state) and data is written to each memory cell MC by such a setting operation that causes a reset state to be switched to a low resistance state for binary storage.

A read operation from a memory cell MC is performed by applying a voltage of 0.4V (in fact, on the order of 1.4V if a voltage drop in the corresponding diode Di is included) to a variable resistance element VR and monitoring a current flowing through the variable resistance element VR. As a result, it is determined whether the variable resistance element VR is in its low resistance or high resistance state.

Referring again to FIG. 2, the setting operation of the resistive memory device according to this embodiment will be described below. FIG. 2 illustrates the states of voltage applied to the bit lines BL and the word lines WL connected to a memory cell array MA in a setting operation of a memory cell MC. In this case, given that the selected memory cell MC to which data is to be written by the setting operation is MC11.

Non-selected bit lines BL00, BL10, and BL11 that are not connected to the selected memory cell MC11 are in "L" state (in this embodiment, Vss=0V). During the setting operation, the selected bit line BL01 that is connected to the selected memory cell MC11 is driven from "L" state (Vss=0V) to "H" state (in this embodiment, voltage VSET). In addition, non-selected word lines WL00, WL02, and WL03 that are not connected to the selected memory cell MC11 are in "H" state (in this embodiment, voltage VSET). During the setting operation, the selected word line WL01 that is connected to the selected memory cell MC11 is driven from the "H" state (voltage VSET) to "L" state (in this embodiment, voltage Vss=0V). As a result, the diode Di in the selected memory cell MC11 is turned to a forward-biased state, which causes current to flow therethrough. Then a potential difference VSET is applied to the selected memory cell MC11 and the corresponding variable resistance element VR changes from a high resistance state to a low resistance state, after which the setting operation is completed.

Figure 3:
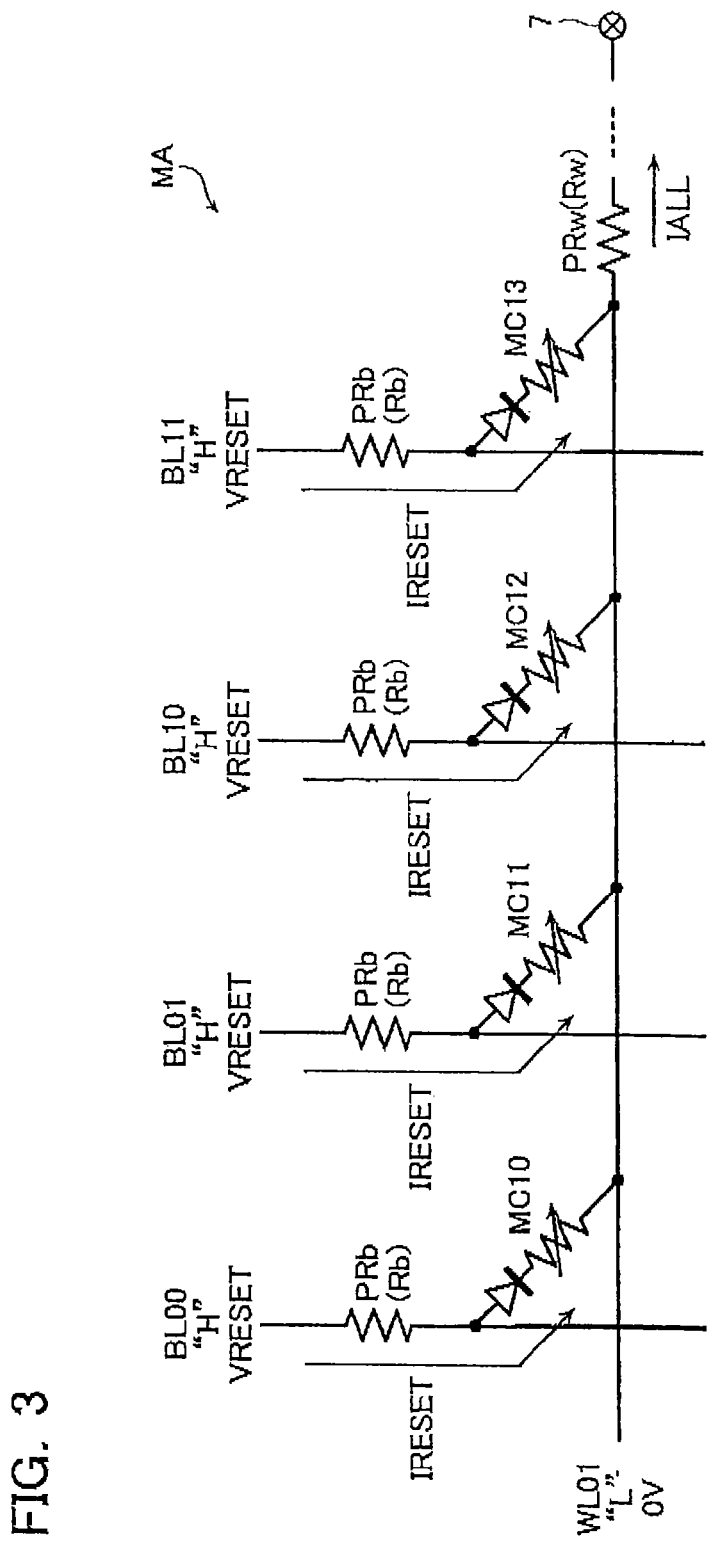
FIG. 3 is an equivalent circuit diagram of a memory cell array in the resistive memory device according to the first embodiment.

Referring now to FIG. 3, reset operations of the resistive memory device will be described below. FIG. 3 is an equivalent circuit diagram of a memory cell array MA in the resistive memory device. Note that the same reference numerals represent the same components as those illustrated in FIG. 2 and description thereof will be omitted in FIG. 3. Although the memory cell array MA of FIG. 3 has the same configuration as that of the memory cell array MA illustrated in FIG. 2, illustration of the configuration of word lines WL00, WL02, and WL03 is omitted in FIG. 3.

FIG. 3 illustrates respective states of the voltage and current applied to the bit lines BL and the word lines WL that are connected to the memory cell array MA, in reset operation of the memory cells MC. In this case, given that selected memory cells MC from which data is erased in parallel (simultaneously) by reset operations are four memory cells MC10 to MC13.

In reset operation, the selected bit lines BL00 to BL11 that are connected to the selected memory cells MC10 to MC13 are driven to "H" state (in this embodiment, voltage VRESET). In this reset operation, the selected word line WL01 that is connected to the selected memory cells MC10 to MC13 is also driven to "L" state (in this embodiment, voltage Vss=0V). In this case, non-selected word lines WL00, WL02, and WL03 that are not connected to the selected memory cells MC10 to MC13 are in "H" state (e.g., voltage VRESET). Further, the reset voltages VRESET being applied to the bit lines BL00 to BL11 are such reference voltages that allow the variable resistance elements VR in the memory cells MC to change from low resistance states to high resistance states, respectively.

Upon voltage being applied to the selected bit lines BL00 to BL11, the diodes Di in the selected memory cells MC10 to MC13 are forward biased and current flows therethrough. A reset current IRESET flows through each of the memory cells MC that allows for a reset operation. Since a current IALL that flows through the word line WL01 is the summation of reset currents IRESET flowing through a number N (in this embodiment, N=4) of memory cells MC on which reset operations are performed in parallel, it is equal to N*IRESET.

Due to the reset voltages VRESET and the reset currents IRESET applied to the bit lines BL00 to BL11, the corresponding variable resistance elements VR change from low resistance states to high resistance states, after which the reset operations are completed.

Now consider the following voltage drop due to parasitic resistances PRb of bit lines BL and a parasitic resistance PRw of a word line WL. The voltage drop due to the parasitic resistance PRb (resistance value Rb) of a bit line BL is obtained by multiplication of the resistance value Rb and a flowing current IRESET. The voltage drop due to the parasitic resistance PRb of the bit line BL is given by IRESET*Rb. In addition, the voltage drop due to the parasitic resistance PRw (resistance value Rw) of a word line WL is obtained by multiplication of the resistance value Rw and a flowing current IALL. The voltage drop due to the parasitic resistance PRw of the word line WL is N*IRESET*Rw. Accordingly, the value of voltage drop in applying reset voltage to a memory cell MC is IRESET*(N*Rw+Rb).

If the reset voltages VRESET applied to the bit lines BL drop due to the parasitic resistances PRb and PRw of the bit lines BL and the word line WL, sufficient reset voltages VRESET cannot be applied to the memory cell MC. In this case, it may not be possible to perform reset operations on the memory cells MC10 to MC13.

In particular, as multiple memory cells MC on which reset operations are performed are concentrated on one end of the corresponding word line WL, and the multiple memory cells MC are spaced farther apart from a word-line contact 7 located at the other end of the word line, the parasitic resistance PRw of the word line WL will have a larger resistance value Rw. As described above, regarding the voltage drop in reset operation, the parasitic resistance PRw of the word line WL is multiplied by the current IALL (=N*IRESET). As the number (N) of memory cells that are operated simultaneously in the memory cell array MA increases to improve the processing speed of the resistive memory device, a voltage drop due to the parasitic resistance PRw of the word line WL will also increase. Therefore, it is necessary to reduce the value of voltage drop due to the parasitic resistance PRw in the word line WL.

Figure 4:
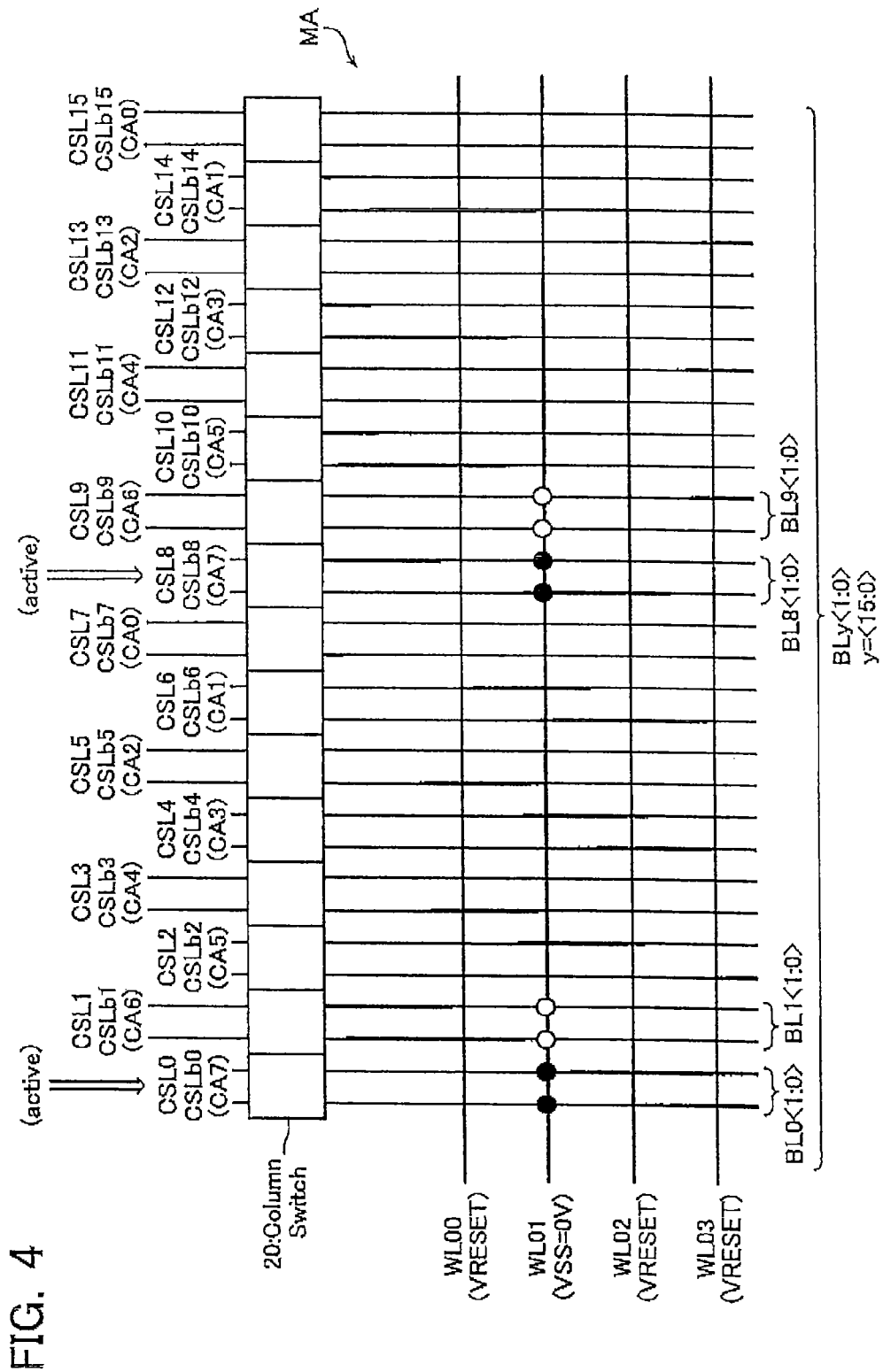
FIG. 4 illustrates respective positions of the memory cells on which reset operations are performed in the resistive memory device according to the first embodiment.

Referring now to FIG. 4, reset operations in a memory cell array MA in the resistive memory device according to this embodiment will be described below. FIG. 4 illustrates respective positions of memory cells MC in reset operation on which reset operations are performed simultaneously in the corresponding memory cell array MA. In FIG. 4, black circles represent those memory cells MC on which reset operations are performed, while white circles represent non-selected memory cells on the same word line WL as the memory cells MC on which the reset operations are performed.

For example, FIG. 4 illustrates 32 bit lines BLy<1:0> (y=<15:0>) and four word lines WL00 to WL03 in the memory cell array MA. Memory cells MC are positioned at intersections between the bit lines BL and the word lines WL as described above.

In FIG. 4, a group of bit lines (e.g., group of bit lines BL0<1:0>) including two bit lines BL is connected to one column switch 20. In addition, a pair of column selection lines CSLy and CSLby (y=<15:0>) are also connected to one column switch 20. The column switches 20 are selectively driven by the column selection lines CSLy and CSLby. Each column switch 20 connects a group of bit lines BLy<1:0> to local data lines LDQ<1:0> or LDQ<3:2> described below so that the group of bit lines can be selectively driven. The bit lines BL to be selectively driven are specified by a plurality of (in this case, 8 different) column address signals CA7 to CA0. In this embodiment, consider four bit lines that are selectively driven at the same time by one column address signal CA.

In this embodiment, four bit lines BL specified by one of the column address signals CA7 to CA0 (e.g., column address signal CA7) are separately arranged within a memory cell array MA.

Specifically, the four bit lines BL selectively driven at the same time by one of the column address signals CA0 to CA7 are divided into two sets of two bit lines each. Further, the two sets of bit lines BL are positioned apart from each other by a certain distance (with other bit lines interposed between the two sets) in the memory cell array MA.

For example, one set including two (bit lines BL0<1:0>) of four bit lines BL specified by the column address signal CA7 is positioned to be connected to one column switch 20 to which column selection lines CSL0 and CSLb0 are connected. In addition, another set including the remaining two (bit lines BL8<1:0>) of the four bit lines BL specified by the column address signal CA7 is positioned to be connected to another column switch 20 to which column selection lines CSL8 and CSLb8 are connected. Consequently, the two sets each including two of four bit lines BL selectively driven at the same time by the column address signal CA7 are positioned apart from each other by a certain distance (with other bit lines interposed between the two sets) in the memory cell array MA.

In addition, respective two sets each including two of four bit lines BL specified by the column address signal CA6 are positioned to be connected to one column switch 20 to which column selection lines CSL1 and CSLb1 are connected, or another column switch 20 to which column selection lines CSL9 and CSLb9 are connected, respectively. Consequently, the two sets each including two of four bit lines BL selectively driven at the same time by the column address signal CA6 are positioned apart from each other by a certain distance with other bit lines interposed between the two sets in the memory cell array MA. In this case, the respective two sets each including two of four bit lines BL selectively driven at the same time by the column address signal CA7 are spaced apart by a certain distance, while two sets each including two of four bit lines BL selectively driven at the same time by the column address signal CA6 are spaced apart by substantially the same distance as those of the column address signal CA7.

Similarly, sets of bit lines BL, each set including two bit lines BL specified by either one of the column address signals CA5 to CA0, are positioned to be connected to respective column switches 20 to which different column selection lines are connected. Consequently, respective sets each including two of four bit lines BL selectively driven at the same time by either one of the column address signals CA5 to CA0 are positioned apart from each other by a certain distance with other bit lines interposed between the two sets in the memory cell array MA.

In addition, there are plural sets of two bit lines BL of four bit lines BL specified by one of the column address signals CA7 to CA0 (through column selection lines CSL0-CSL7 and CSLb0-CSLb7). These sets are arranged, from one end of the memory cell array MA, in accordance with an order of the column address signals CA7-CA0. Furthermore, there are additional plural sets of the other two bit lines BL of four bit lines BL specified by one of the column address signals CA7 to CA0 (through column selection lines CSL8-CSL15 and CSLb8-CSLb15). These sets are also arranged in the memory cell array MA, in accordance with an order of the column address signals CA7 to CA0, such that the sets of two bit lines are arranged in an order in accordance with the plural column address signals CA0-CA7. Specifically, arrangement in accordance with an order of the column address signals are repeated in the memory cell array. Consequently, sets of bit lines BL specified by the multiple different address signals CA7 to CA0 are repeatedly arranged in the memory cell array MA in accordance with the column address signal CA0-CA7. In other words, the bit lines BL are separately arranged within the memory cell array MA so that the repetitive arrangement of bit lines BL specified by the multiple address signals CA7 to CA0 exhibits a translational symmetry.

Reset operations in the resistive memory device so configured will be described below. Four memory cells MC on which reset operations are performed simultaneously are specified by a column address signal CA (e.g., column address signal CA7). The column selection lines CSL0 and CSLb0 as well as CSL8 and CSLb8 are selectively driven by the column address signal CA7, by which the corresponding two column switches 20 are selected. The column switches 20 apply reset voltages VRESET to four bit lines in the groups of bit lines BL0<1:0> and BL8<1:0>. In addition, in reset operation, the selected word line WL01 is driven to a voltage Vss=0V, while non-selected word lines WL00, WL02, and WL03 are driven to voltages VRESET. The memory cells MC selected by the column address signal CA7 are located at respective intersections between the selected bit lines BL0<1:0> and BL8<1:0> and the selected word line WL01. They are separately arranged in a direction in which the word line WL01 extends.

The voltages VRESET are applied to the selected memory cells indicated by the black circles in FIG. 4, and reset operations are then performed thereon. On the other hand, no reset voltage VRESET is applied to the bit lines BL of other memory cells indicated by the white circles in FIG. 4 because their corresponding column switches 20 have not been selectively driven by the column selection lines CSL1 and CSLb1 as well as CSL9 and CSLb9. Therefore, no reset operation is performed on the memory cells MC indicated by the white circles. In addition, no reset operation is performed on the other memory cells MC positioned at respective intersections between the other bit lines BL and word lines WL because their corresponding bit lines BL and word lines WL have not also been selectively driven.

Figure 5:
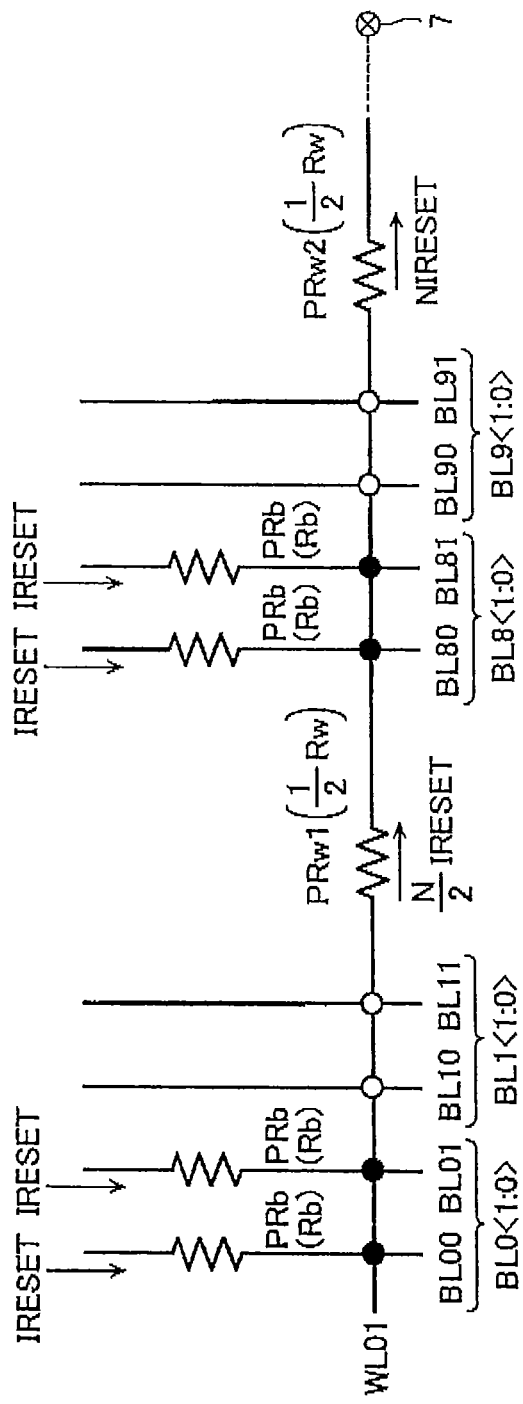
FIG. 5 illustrates parasitic resistances of bit lines and a word line in the resistive memory device according to the first embodiment.

Referring now to FIG. 5, the voltage drop due to respective parasitic resistances PRb and PRw of bit lines BL and a word line WL when the reset operations are performed in this manner will be described below. FIG. 5 illustrates respective parasitic resistances PRb and PRw of bit lines BL and a word line WL in reset operation.

The voltage drop due to the parasitic resistance PRb (resistance value Rb) of a bit line BL is obtained by multiplication of the resistance value Rb and a flowing current IRESET. The voltage drop due to the parasitic resistance PRb of the bit line BL is IRESET*Rb.

In this case, as illustrated in FIG. 4, the memory cells MC on which reset operations are performed are separately arranged adjacent to one end and near the center of the word line WL. In this case, the parasitic resistance PRw of the word line WL is thought of two parasitic resistances PRw1 and PRw2 (each with resistance value Rw/2). In this case, the amount of current is N/2*IRESET since the current flowing through the parasitic resistance PRw1 is a total of the reset current IRESET flowing through each half of N memory cells MC on which reset operations are performed simultaneously. The voltage drop due to the parasitic resistance PRw1 (resistance value Rw/2) of the word line WL is obtained by multiplication of the resistance value Rw/2 and a flowing current N/2*IRESET. The voltage drop due to the parasitic resistance PRw1 is N/4*IRESET*Rw.

In addition, the voltage drop due to the parasitic resistance PRw2 (resistance value Rw/2) of the word line WL is obtained by multiplication of the resistance value Rw/2 and a flowing current N*IRESET. The voltage drop due to the parasitic resistance PRw2 is N/2*IRESET*Rw. The value of voltage drop due to the parasitic resistance PRw across the word line is ¾*N*IRESET*Rw.

Accordingly, the value of voltage drop in applying reset voltage to a memory cell MC is IRESET*(¾*N*Rw+Rb).

If a group of bit lines BLy<1:0> selectively driven by one column address signal CA is adjacently positioned in the memory cell array MA, then the memory cells MC on which reset operations are performed, as illustrated in FIG. 3, may be concentrated on one end of the corresponding word line WL. In this case, the value of voltage drop in performing reset operation is IRESET*(N*Rw+Rb).

In contrast, according to the resistive memory device of this embodiment, the bit lines BL specified by one of the column address signals CA7 to CA0 are separately arranged within the memory cell array MA. Therefore, each of the memory cells MC with the largest voltage drop that are specified by the column address signal CA7 has a voltage of drop value in reset operation, IRESET*(¾ *N*Rw+Rb), which means reduction in the value of voltage drop in reset operation.

In this embodiment, respective four bit lines BL specified by one column address signal CA are separately arranged within the memory cell array MA. That is, regarding the bit lines BL, some of the multiple bit lines BL specified and selectively driven at the same time by one column address signal CA are positioned apart from the remaining ones specified and selectively driven at the same time by the same column address signal CA by a certain distance (with other bit lines between them) in the memory cell array MA. In addition, the bit lines BL are arranged in such a way that respective sets of bit lines BL specified by different column address signals are repeatedly arranged in the memory cell array MA in accordance with an order of the column address. This arrangement of bit lines BL allows reduction in the value of voltage drop due to the parasitic resistances PRb and PRw of the bit lines BL and the word line WL in performing reset operation. In particular, this may reduce voltage drop due to the number (N) of memory cells on which reset operations are performed simultaneously and the word line WL.

The resistive memory device according to this embodiment may prevent any drop in reset voltage VRESET to be applied to memory cells MC due to the voltage drop of wiring resistance, even if the number of memory cells to be operated simultaneously increases. The resistive memory device of this embodiment may ensure that reset operations are performed on a large number of memory cells.

[Configuration of Control Circuit]

Figure 6:
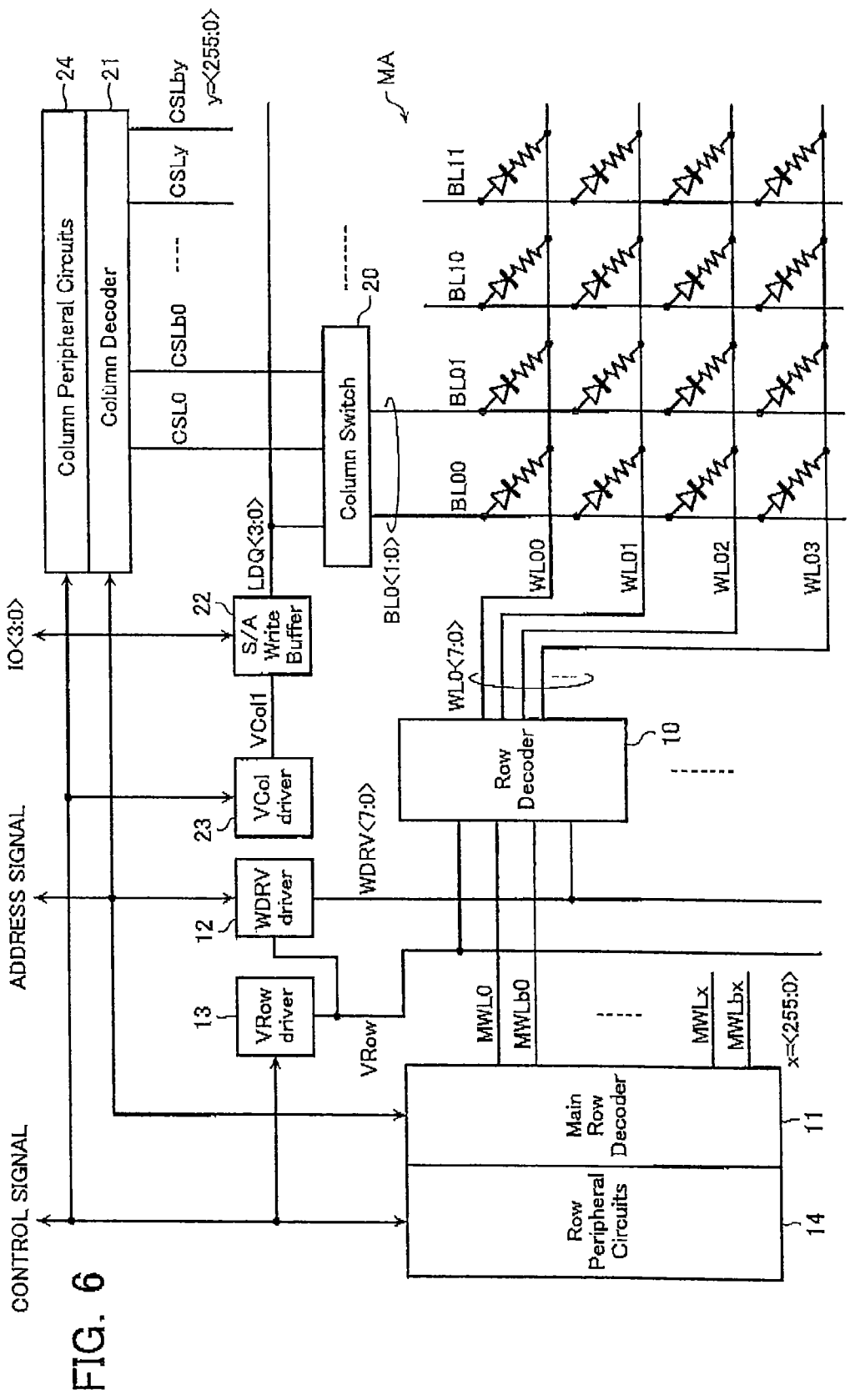
FIG. 6 is a block diagram illustrating an example arrangement of column/row control circuits in the resistive memory device according to the first embodiment.

A circuit configuration of the resistive memory device will be described with reference to FIGS. 6 to 14. In the memory cell array MA of FIG. 6, for example, 2K-bit (2048) unit memory cells MC are arranged in the longitudinal direction of the bit line BL, and 512-bit unit memory cells MC are arranged in the longitudinal direction of the word line WL. Therefore, the case in which 1M-bit (about $10^6$) unit memory cells MC are arranged in the one memory cell array MA will be described by way of example. FIG. 6 is a block diagram illustrating an example of the arrangement of a column control circuit and a row control circuit in the resistive memory device.

Referring to FIG. 6, the row control circuit includes a row decoder 10, a main row decoder 11, a write drive line driver 12, a row power supply line driver 13, and a row-system peripheral circuit 14. The column control circuit includes a column switch 20, a column decoder 21, a sense amplifier/write buffer 22, a column power supply line driver 23, and a column-system peripheral circuit 24.

The word line WL of the embodiment has a hierarchical structure, and the main row decoder 11 selectively drives one of 256 pairs of main word lines MWLx and MWLbx (x=<255:0>). For example, in the selected main word lines MWLx and MWLbx, the main word line MWLx becomes the "H" state and the main word line MWLbx becomes the "L" state. On the contrary, in the non-selected main word lines MWLx and MWLbx, the main word line MWLx becomes the "L" state and the main word line MWLbx becomes the "H" state. One pair of main word lines MWLx and MWLbx is connected to one row decoder 10. The row decoder 10 selectively drives one of eight word lines WL included in a group of word line WLx<7:0>. The group of word line WLx<7:0> is located under the hierarchy of the main word lines MWLx and MWLbx. The row decoder 10 connected to the main word lines MWLx and MWLbx selectively driven by the main row decoder 11 further selectively drives the word line WL, thereby selectively driving one word line WL.

Eight write drive lines WDRV<7:0> and row power supply line VRow are connected to the write drive line driver 12, and the row power supply line VRow is connected to the row power supply line driver 13. The write drive lines WDRV<7:0> and the row power supply line VRow are connected to the row decoder 10. The voltage is applied to the write drive line WDRV<7:0> and the row power supply line VRow in order that the row decoder 10 drives the word line WL. Specifically, during the reset operation, the voltage Vss (=0 V) is supplied to one write drive line WDRV corresponding to the selected word line WL in the eight write drive lines WDRV<7:0>, and the voltage VRESET is supplied to other write drive lines WDRV of the write drive lines WDRV<7:0>. The voltage (VRESET) supplied to the word line WL under the hierarchy of the non-selected main word line MWL and MWLbx is applied to the row power supply line VRow.

The row-system peripheral circuit 14 manages the whole of the resistive memory device. The row-system peripheral circuit 14 receives a control signal from an external host apparatus, the row-system peripheral circuit 14 reads, write, and erases the data, and the row-system peripheral circuit 14 performs data input and output management.

The bit line BL of the embodiment also has the hierarchical structure, and the column decoder 21 selectively drives plural pairs of column selection lines CSLy and CSLby in 256 pairs of column selection lines CSLy and CSLby (y=<255:0>). For example, in the selected column selection lines CSLy and CSLby, the column selection line CSLy becomes the "H" state and the column selection line CSLby becomes the "L" state. On the contrary, in the non-selected column selection lines CSLy and CSLby, the column selection line CSLy becomes the "L" state and the column selection line CSLby becomes the "H" state. One pair of column selection lines CSLy and CSLby is connected to one column switch 20. The column switch 20 selectively drives a group of bit line BLy<1:0> including two bit lines BL located under the hierarchy of the column selection lines CSLy and CSLby. The column switch 20 that is connected to the column selection lines CSLy and CSLby selectively driven by the column decoder 21 further selectively drives the bit line BL, thereby selectively driving the bit line BL.

Four local data lines LDQ<3:0> are connected to the sense amplifier/write buffer 22. The local data lines LDQ<3:0> are divided into two sets of two local data lines LDQ<1:0> or LDQ<3:2> and connected to the column switch 20. One set of the local data lines LDQ<1:0> or LDQ<3:2> is connected to one column switch. The sense amplifier/write buffer 22 detects and amplifies signals read on the local data lines LDQ<3:0>, and the sense amplifier/write buffer 22 supplies the write data fed from data input and output lines IO<3:0> to the memory cell MC through the column switch 20. The voltage is applied to the local data line LDQ<3:0> in order that the column switch 20 drives the bit line BL. Specifically, voltage VRESET is supplied to four local data lines LDQ<3:0> in the reset operation. The column power supply line driver 23 is connected to the sense amplifier/write buffer 22 through a column power supply line VColl.

The column-system peripheral circuit 24 manages the whole of the resistive memory device. The column-system peripheral circuit 24 receives a control signal from an external host apparatus, the column-system peripheral circuit 24 reads, write, and erases the data, and the column-system peripheral circuit 24 performs data input and output management.

The detailed configuration of the row control circuit will be described with reference to FIGS. 7 to 10. FIGS. 7 to 10 are circuit diagrams illustrating an example of the configuration of the row control circuit in the resistive memory device.

[Configuration of Row Decoder 10]

Figure 7:
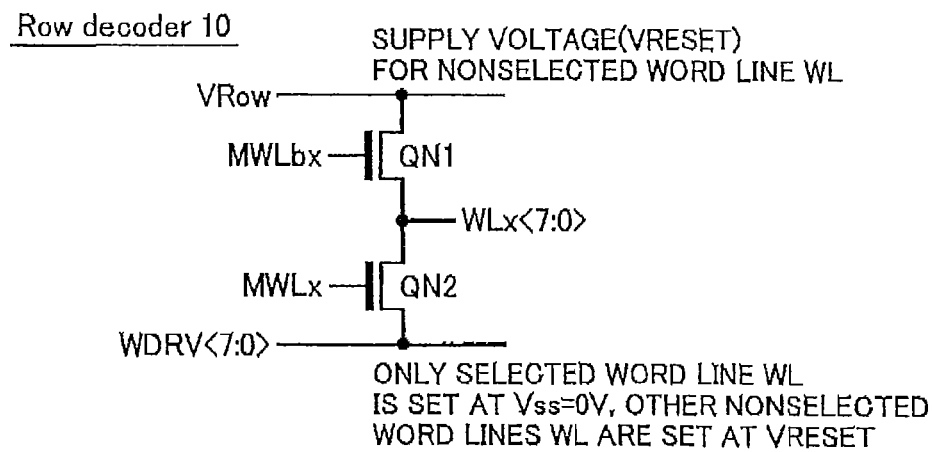
FIG. 7 is a circuit diagram illustrating an example configuration of a row control circuit in the resistive memory device according to the first embodiment.

As illustrated in FIGS. 6 and 7, one of the 256 pairs of main word lines MWLx and MWLbx (x=<255:0>), the row power supply line VRow, and the write drive lines WDRV<7:0> are connected to the row decoder 10. The group of word line WLx<7:0> is connected to the row decoder 10, and the group of word line WLx<7:0> is connected to the plural memory cells MC that are arrayed in line. As described above, the group of word line WLx<7:0> connected to the one row decoder 10 includes the eight wirings of word line WLx0 to word line WLx7. Similarly the write drive lines WDRV<7:0> are the eight wirings WDRV0 to WDRV7.

As illustrated in FIG. 7, the row decoder 10 includes eight transistor pairs each of which sources of two NMOS transistors QN1 and QN2 are connected to each other. The main word line MWLbx is connected to a gate of the transistor QN1 and the row power supply line VRow is connected to a drain of the transistor QN1. The main word line MWLx is connected to the gate of the transistor QN2 and one of the write drive lines WDRV<7:0> is connected to the drain of the transistor QN2. The sources of the transistors QN1 and QN2 are connected to one of the word lines WL included in the group of word line WLx<7:0>

[Configuration of Main Row Decoder 11]

Figure 8:
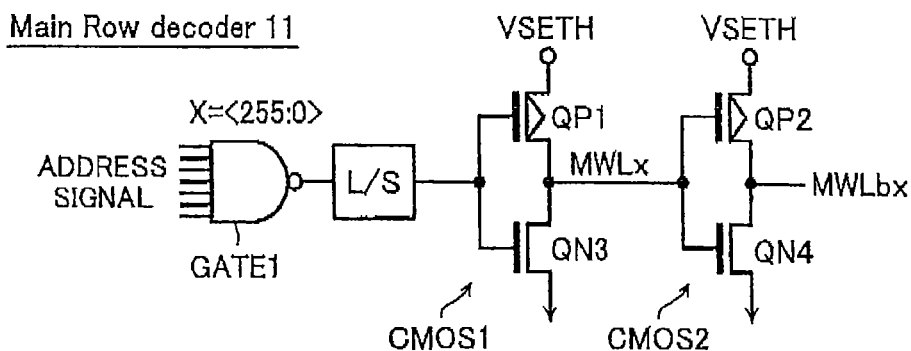
FIG. 8 is a circuit diagram illustrating an example configuration of a row control circuit in the resistive memory device according to the first embodiment.

As illustrated in FIGS. 6 and 8, 256 pairs of main word lines MWLx and MWLbx (x=<255:0>) and an address signal line are connected to the main row decoder 11. The word line WL of the resistive memory device of the embodiment has the hierarchical structure. The main row decoder 11 is a pre-decoder. One set of main word lines MWLx and MWLbx is connected to eight transistor pairs (QN1 and QN2 of FIG. 7) in one row decoder 10, and one row decoder 10 can select one of the eight word lines WLx<7:0>. The main row decoder 11 includes a circuit of FIG. 8 in each set of main word lines MWLx and MWLbx.

As illustrated in FIG. 8, in one main row decoder 11, the address signal line connected to the main row decoder 11 is connected to a logic gate GATE1. An output signal of the logic gate GATE1 is supplied to an input terminal of a CMOS inverter CMOS1 through a level shifter L/S. The CMOS inverter CMOS1 includes a PMOS transistor QP1 and an NMOS transistor QN3. A power supply VSETH is connected to the source of the transistor QP1, and the source of the transistor QN3 is grounded. The drains of the transistors QP1 and QN3 are connected to the main word line MWLx.

The main word line MWLx is connected to a CMOS inverter CMOS2. The CMOS inverter CMOS2 includes a PMOS transistor QP2 and an NMOS transistor QN4. The power supply VSETH is also connected to the source of the transistor QP2 and the source of the transistor QN4 is grounded. The drains of the transistors QP2 and QN4 are connected to the main word line MWLbx.

[Configuration of Write Drive Line Driver 12]

Figure 9:
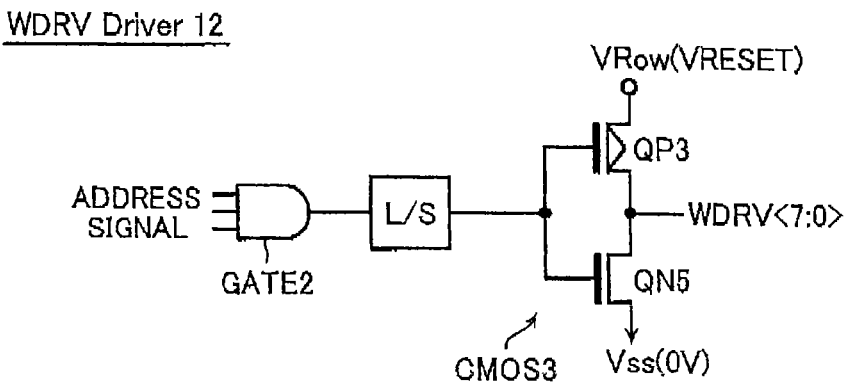
FIG. 9 is a circuit diagram illustrating an example configuration of a row control circuit in the resistive memory device according to the first embodiment.

As illustrated in FIGS. 6 and 9, the row power supply line VRow and the address signal line are connected to the write drive line driver 12. At this point, the write drive line driver 12 is also a pre-decoder.

The address signal line connected to the write drive line driver 12 is connected to a logic gate GATE2. An output signal of the logic gate GATE2 is supplied to an input terminal of a CMOS inverter CMOS3 through a level shifter L/S. The CMOS inverter CMOS3 includes a PMOS transistor QP3 and an NMOS transistor QN5. The row power supply line VRow to which the voltage VRESET is applied as described later is connected to the source of the transistor QP3, and the source of the transistor QN5 is grounded. The drains of the transistors QP3 and QN5 are connected to the write drive lines WDRV<7:0>.

[Configuration of Row Power Supply Line Driver 13]

Figure 10:
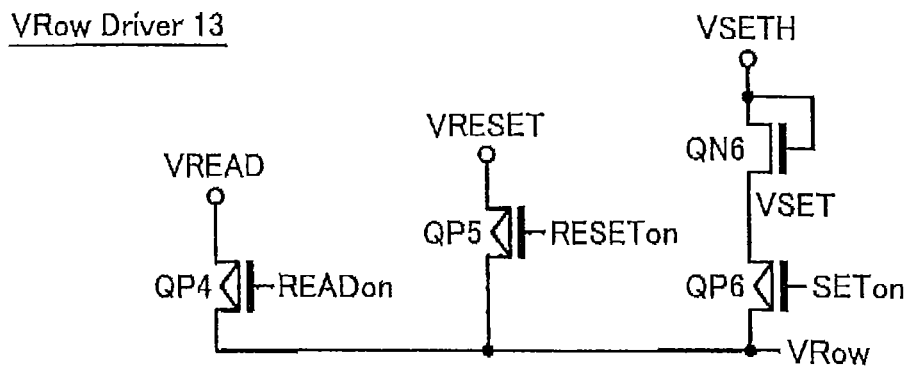
FIG. 10 a circuit diagram illustrating an example configuration of a row control circuit in the resistive memory device according to the first embodiment.

As illustrated in FIGS. 6 and 10, the row power supply line VRow and a control signal line are connected to the row power supply line driver 13. In the row power supply line driver 13, the power supply VSETH is connected to the drain and gate of the NMOS transistor QN6. The source of the transistor QN6 is connected to the row power supply line VRow through a PMOS transistor QP6. A control signal SETon is supplied to the gate of the transistor QP6.

In the row power supply line driver 13, the power supply VREAD is connected to the row power supply line VRow through a PMOS transistor QP4, and the power supply VRESET is connected to the row power supply line VRow through a PMOS transistor QP5. A control signal READon is supplied to the gate of the transistor QP4, and a control signal RESETon is supplied to the gate of the transistor QP5. The control signals READon and RESETon are changed from the "H" state to the "L" state in reading the data and in the reset operation, respectively.

A detailed configuration of the column control circuit will be described with reference to FIGS. 11 to 14. FIGS. 11 to 14 are circuit diagrams illustrating an example of the configuration of the column control circuit in the resistive memory device.

[Configuration of Column Switch 20]

Figure 11:
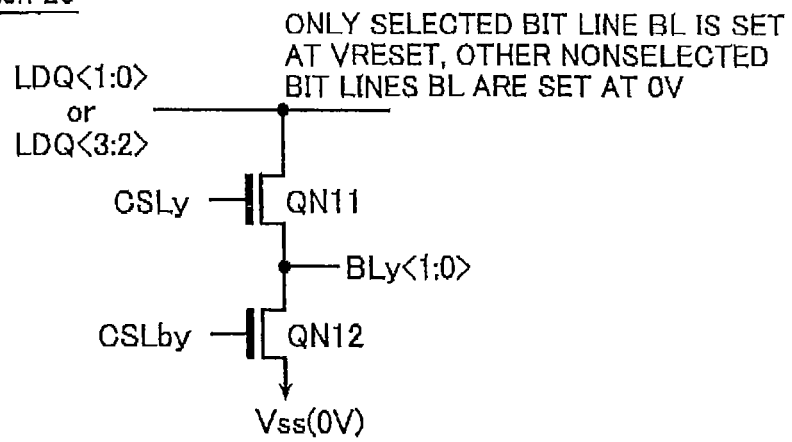
FIG. 11 is a circuit diagram illustrating an example configuration of a column control circuit in the resistive memory device according to the first embodiment.

As illustrated in FIGS. 6 and 11, one of the 256 pairs of column selection lines CSLy and CSLby (y=<255:0>) and one of the sets of local data lines LDQ<1:0> or LDQ<3:2> are connected to the column switch 20. In this case, the local data lines LDQ<1:0> are connected to the column switch 20 which is connected to one pair (for example, CSL0 and CSLb0) of pairs of column selection line CSLy and CSLby (CSL0 and CSLb0 or CSL8 and CSLb8 shown in FIG. 4) selected by the same column address signal CA (for example, CA7 shown in FIG. 4). In addition, it is assumed that the local data lines LDQ<3:2> are connected to the column switch 20 which is connected to another pair (for example, CSL8 and CSLb8). The group of bit line BLy<1:0> is connected to the column switch 20, and the group of bit line Bly<1:0> is connected to the plural memory cells MC that are arranged in line. As described above, the group of bit line BLy<1:0> connected to one column switch 20 includes the two wirings. Similarly, the local data lines LDQ<1:0> and LDQ<3:2> are the pair of two wirings LDQ0 and LDQ1 or LDQ2 and LDQ3.

As illustrated in FIG. 11, the column switch 20 includes two pairs of transistors each of which sources of two NMOS transistors QN11 and QN12 are connected to each other. The column selection line CSLy is connected to the gate of the transistor QN11, and one of the local data lines LDQ<1:0> or LDQ<3:2> is connected to the drain of the transistor QN11. The column selection line CSLby is connected to the gate of the transistor QN12, and the drain of the transistor QN12 is grounded. The sources of the transistors QN11 and QN12 are connected to one of the bit lines BL included in the group of bit line BLy<1:0>.

[Configuration of Column Decoder 21]

Figure 12:
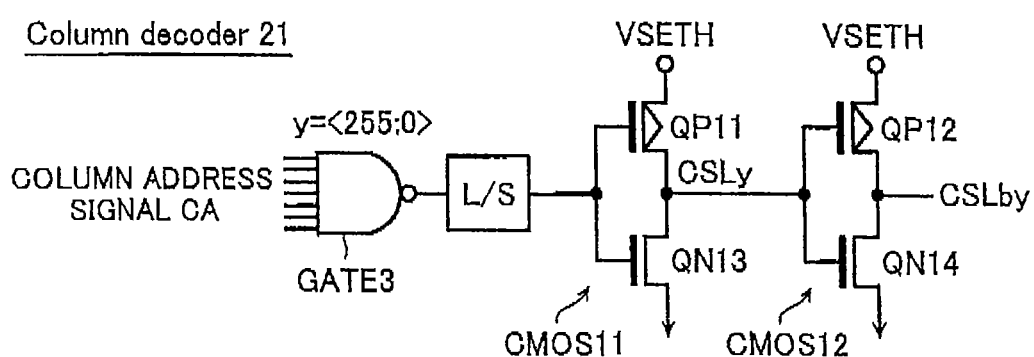
FIG. 12 is a circuit diagram illustrating an example configuration of a column control circuit in the resistive memory device according to the first embodiment.

As illustrated in FIGS. 6 and 12, the 256 pairs of column selection lines CSLy and CSLby (y=<255:0>) and the address signal line into which a column address signal CA is fed are connected to the column decoder 21. In the resistive memory device of the embodiment, one set of column selection lines CSLy and CSLby is connected to two transistor pairs (QN11 and QN12 of FIG. 11) in one column switch 20, and one column switch 20 selectively drives two groups of bit line Bly<1:0>. The column decoder 21 includes a circuit of FIG. 12 in each pair of column selection lines CSLy and CSLby.

As illustrated in FIG. 12, in one column decoder 21, the address signal line connected to the column decoder 21 is connected to a logic gate GATE3. An output signal of the logic gate GATE3 is supplied to an input terminal of a CMOS inverter CMOS11 through a level shifter L/S. The CMOS inverter CMOS11 includes a PMOS transistor QP11 and an NMOS transistor QN13. The power supply VSETH is connected to the source of the transistor QP11 and the source of the transistor QN13 is grounded. The drains of the transistors QP11 and QN13 are connected to the column selection line CSLy.

The column selection line CSLy is connected to a CMOS inverter CMOS12. The CMOS inverter CMOS12 includes a PMOS transistor QP12 and an NMOS transistor QN14. The power supply VSETH is also connected to the source of the transistor QP12, and the source of the transistor QN14 is grounded. The drains of the transistors QP12 and QN14 are connected to the column selection line CSLby.

[Configuration of Sense Amplifier/Write Buffer 22]

Figure 13:
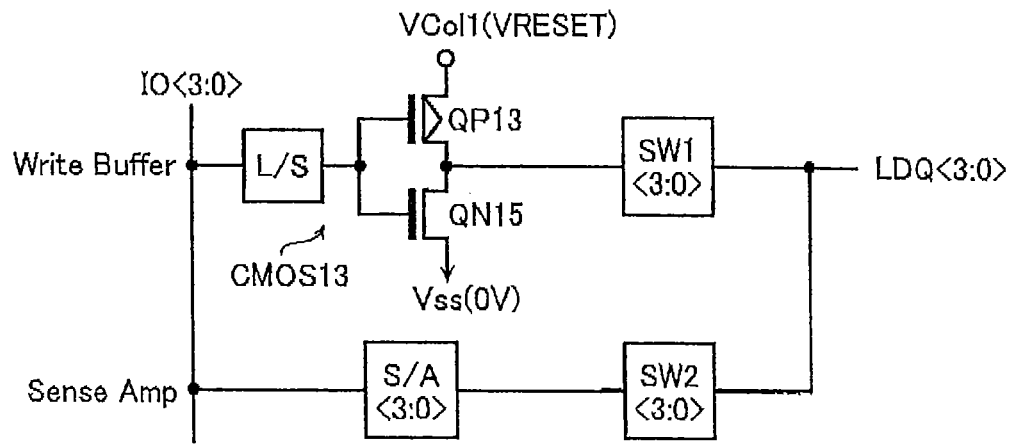
FIG. 13 is a circuit diagram illustrating an example configuration of a column control circuit in the resistive memory device according to the first embodiment.

As illustrated in FIGS. 6 and 13, the column power supply line VColl, the local data lines LDQ<3:0>, and the data input and output lines IO<3:0> are connected to the sense amplifier/write buffer 22. A configuration of the write buffer portion will be described below. The data input and output lines IO<3:0> connected to the sense amplifier/write buffer 22 are connected to a CMOS inverter CMOS13 through a level shifter L/S. The CMOS inverter CMOS13 includes a PMOS transistor QP13 and an NMOS transistor QN15. The column power supply line VColl is connected to the source of the transistor QP13. The reset voltage VRESET is applied to the column power supply line VColl as described later. The source of the transistor QN15 is grounded. The drains of the transistors QP13 and QN15 are connected to the local data lines LDQ<3:0> through a switch SW1.

Then a sense amplifier portion will be described below. The data input and output lines IO<3:0> connected to the sense amplifier/write buffer 22 are connected to a sense amplifier S/A. A various type of sense amplifier may be used as the sense amplifier S/A, such as single end type, differential type using a reference cell, and so on. An output terminal of the sense amplifier S/A is connected to the local data lines LDQ<3:0> through a switch SW2.

[Configuration of Column Power Supply Line Driver 23]

Figure 14:
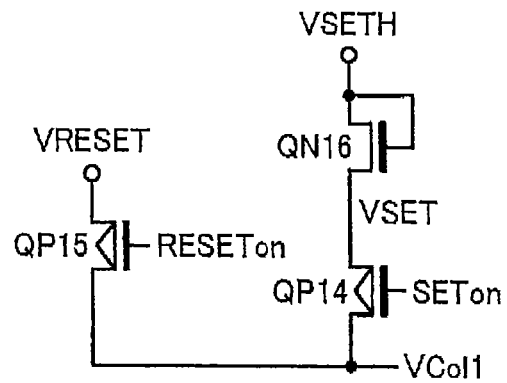
FIG. 14 is a circuit diagram illustrating an example configuration of a column control circuit in the resistive memory device according to the first embodiment.

As illustrated in FIGS. 6 and 14, the column power supply line VColl and the control signal line are connected to the column power supply line driver 23. In the column power supply line driver 23, the power supply VSETH is connected to a drain and a gate of an NMOS transistor QN16, and a source of the transistor QN16 is connected to the column power supply line VColl through a PMOS transistor QP14. The control signal SETon is supplied to the gate of the transistor QP14.

In the column power supply line driver 23, the power supply VRESET is connected to the column power supply line VColl through a PMOS transistor QP15. The control signal RESETon is supplied to the gate of the transistor QP15. The control signal RESETon is changed from the "H" state to the "L" state in the reset operation.

Reset operations in the resistive memory device so configured will now be described below. Referring first to FIGS. 6 to 10, the operation of a row control circuit in the resistive memory device in reset operation will be described below. As illustrated in FIG. 6, the word lines WL have a hierarchical structure. The voltage, which is applied to write drive lines WDRV<7:0> or a row power supply line VRow, is applied to a group of word lines WLx<7:0> selectively driven by the main row decoder 11 and the row decoder 10. Firstly, the operation for applying voltage to the write drive lines WDRV<7:0> and the row power supply line VRow that are connected to the row decoder 10 will be described below.

[Operation of Row Power Supply Line Driver 13]

In reset operation, at a row power supply line driver 13, a control signal (RESETon signal) that has been supplied to the gate of a transistor QP5 becomes "L" state and the transistor QP5 is conducting. The row power supply line driver 13 drives the row power supply line VRow to a voltage VRESET in reset operation.

[Operation of Write Drive Line Driver 12]

A write drive line driver 12 has a logic gate GATE2 to which an address signal is input. Based on the address signal, the logic gate GATE2 supplies to the input terminal of a CMOS inverter CMOS3 an "H" signal for one of the write drive lines (e.g., WDRV1) that corresponds to the address signal, and an "L" signal for every other write drive line that does not correspond to the address signal. For a write drive line (e.g., WDRV1) that corresponds to the address signal, an "H" signal is supplied to the input terminal of the CMOS inverter CMOS3, and a ground voltage Vss (e.g., 0V) is applied to the write drive line WDRV1 via the conducting transistor QN5. For every other write drive line that does not correspond to the address signal, an "L" signal is supplied to the input terminal of the CMOS inverter CMOS3, and the voltage of the row power supply line VRow (VRESET) is applied to the write drive lines WDRV via the conducting transistor QP3.

Secondly, how the main word lines MWLx, MWLbx and the word lines WLx<7:0> are selectively driven by the main row decoder 11 and the row decoder 10 will be described below.

[Operation of Main Row Decoder 11]

An address signal is also supplied to the input terminal of a logic gate GATE1 in the main row decoder 11. Based on the address signal, the logic gate GATE1 supplies to the input terminal of a CMOS inverter CMOS1 an "L" signal for the selected x (e.g., x=0) of x=<255:0>, and an "H" signal for every non-selected x.

Firstly, description is made on the selected x (e.g., x=0). For the selected x (e.g., x=0), an "L" signal is supplied to the input terminal of the CMOS inverter CMOS1, and an "H" signal of the power supply VSETH is supplied to a main word line MWL0 via the conducting transistor QP1. In addition, the "H" signal of the main word line MWL0 is supplied to the input terminal of a CMOS inverter CMOS2, and the "L" signal at ground voltage Vss is supplied to a main word line MWLb0 via the conducting transistor QN4. That is, for the selected x (e.g., x=0), an "H" signal is supplied to the main word line MWL0, while an "L" signal is supplied to the main word line MWLb0.

Secondly, description is made on the non-selected x. For each non-selected x, an "H" signal is supplied to the input terminal of a CMOS inverter CMOS1, and an "L" signal at ground voltage Vss is supplied to a main word line MWLx via the conducting transistor QN3. In addition, the "L" signal of the main word line MWLx is supplied to the input terminal of a CMOS inverter CMOS2, and the "H" signal of the power supply VSETH is supplied to a main word line MWLbx via the conducting transistor QP2. That is, for each non-selected x, an "L" signal is supplied to a respective main word line MWLx, while an "H" signal is supplied to a respective main word line MWLbx.

[Operation of Row Decoder 10]

The row decoder 10 applies the voltage of the row power supply line VRow or the write drive lines WDRV to the corresponding word lines WL based on the signals supplied to the main word lines MWLx and MWLbx. For the selected x (e.g., x=0), an "H" signal is supplied to the main word line MWL0 and an "L" signal is supplied to the main word line MWLb0. Since an "L" signal is supplied to the gate of a transistor QN1 and an "H" signal is supplied to the gate of a transistor QN2 in the row decoder 10, the voltage of the write drive lines WDRV<7:0> is applied to the group of word lines WL0<7:0> via the conducting transistor QN2. In this case, a ground voltage (e.g., 0V) is applied to a write drive line (e.g., WDRV1) that corresponds to the address signal, and the voltage of the row power supply line VRow (e.g., VRESET) is applied to the other write drive lines that do not correspond to the address signal. The ground voltage (e.g., 0V) is only applied to one of the word lines WL01 among the group of word lines WL0<7:0> that corresponds to the address signal, while the voltage VRESET is applied to the other word lines WL.

In addition, for each non-selected x, an "L" signal is supplied to a main word line MWLx and an "H" signal is supplied to a main word line MWLbx. Since an "H" signal is supplied to the gate of the transistor QN1 and an "L" signal is supplied to the gate of the transistor QN2 in the row decoder 10, the voltage of the row power supply line VRow (VRESET) is applied to the group of word lines WLx<7:0> via the conducting transistor QN1. As a result, in reset operation, the ground voltage (0V) is only applied to one of the word lines WL01 that is selected by the address signal, while the voltage of the row power supply line VRow (VRESET) is applied to every other word line WL.

Referring now to FIG. 6 and FIGS. 11 to 14, the operation of a column control circuit in the resistive memory device in reset operation will be described below. The voltage, which is applied to local data lines LDQ<3:0>, is applied to a group of bit lines BLy<1:0> selectively driven by a column decoder 21 and a column switch 20. In addition, the voltage of a column power supply line VCol1 is applied to the local data lines LDQ<3:0> via a sense amplifier/write buffer 22. Firstly, the operation for applying the voltage to the local data lines LDQ<3:0> and the column power supply line VCol1 will be described below.

[Operation of Column Power Supply Line Driver 23]

In reset operation, at a column power supply line driver 23, a control signal (RESETon signal) that has been supplied to the gate of a transistor QP15 becomes "L" state and the transistor QP15 is conducting. The column power supply line driver 23 drives the column power supply line VCol1 to a voltage VRESET in reset operation.

[Operation of Sense Amplifier/Write Buffer 22]

In reset operation, at a sense amplifier/write buffer 22, switches SW1 of the write buffer part turn on and become conducting, while switches SW2 of the sense amplifier part turn off and become non-conducting. Write data is supplied to the sense amplifier/write buffer 22 from data input/output lines IO<3:0>. The write data is supplied to the input terminal of a CMOS inverter CMOS13 via a level shifter L/S. In response to this data, reset voltage VRESET is transferred to four local data lines LDQ<3:0> from the output terminal of the CMOS inverter CMOS13 via the switches SW1.

Secondly, how column selection lines CSLy and CSLby and a group of bit lines BLy<1:0> are selectively driven by the column decoder 21 and the column switch 20 will be described below.

[Operation of Column Decoder 21]

A column address signal CA is supplied to the input terminal of a logic gate GATE3 in the column decoder 21. Based on the column address signal CA, the logic gate GATE3 supplies to the input terminal of a CMOS inverter CMOS11 an "L" signal for each y (e.g., y=0.8) selected from y=<255:0>, and an "H" signal for each non-selected y.

Firstly, description is made on the selected y (e.g., y=0.8). For each selected y (e.g., y=0.8), an "L" signal is supplied to the input terminal of the CMOS inverter CMOS11, and an "H" signal of the power supply VSETH is supplied to each of column selection lines CSL0 and CSL8 via the conducting transistor QP11. In addition, the "H" signal of each column selection lines CSL0 and CSL8 is supplied to the input terminal of a CMOS inverter CMOS12, and the "L" signal at ground voltage Vss is supplied to each of column selection lines CSLb0 and CSLb8 via the conducting transistor QN14. That is, for each selected y (e.g., y=0.8), an "H" signal is supplied to each of the column selection lines CSL0 and CSL8, while an "L" signal is supplied to each of column selection lines CSLb0 and CSLb8.

Secondly, description is made on the non-selected y For each non-selected y, an "H" signal is supplied to the input terminal of the CMOS inverter CMOS11, and an "L" signal at ground voltage Vss is supplied to the column selection line CSLy via the conducting transistor QN13. In addition, the "L" signal of the column selection line CSLy is supplied to the input terminal of the CMOS inverter CMOS12, and an "H" signal of the power supply VSETH is supplied to the column selection line CSLby via the conducting transistor QP12. That is, for each non-selected y, an "L" signal is supplied to a column selection line CSLy, while an "H" signal is supplied to a column selection line CSLby.

[Operation of Column Switch 20]

The column switch 20 applies the voltage of local data lines LDQ<1:0> or LDQ<3:2> to the bit lines BL based on the signals supplied to the column selection lines CSLy and CSLby. For the selected y (e.g., y=0.8), an "H" signal is supplied to each of the column selection lines CSL0 and CSL8 and an "L" signal is supplied to each of the column selection lines CSLb0 and CSLb8. An "H" signal is supplied to the gate of a transistor QN11 and an "L" signal is supplied to the gate of a transistor QN12 in the column switch 20. Thus, the voltage of the local data lines LDQ<1:0> or LDQ<3:2> is applied to each of the selected groups of bit lines BL0<1:0> and BL8<1:0> via the conducting transistor QN11. Reset voltage (VRESET) is applied to the local data lines LDQ<3:0>, which reset voltage is in turn applied to the bit lines BL00 and BL01 as well as BL80 and BL81.

On the other hand, for each non-selected y, an "L" signal is supplied to the column selection line CSLy and an "H" signal is supplied to the column selection line CSLby. An "L" signal is supplied to the gate of the transistor QN11 and an "H" signal is supplied to the gate of the transistor QN12 in the column switch 20. Thus, a ground voltage Vss=0V is applied to the group of bit lines BLy<1:0> via the conducting transistor QN12. As a result, in reset operation, the voltages VRESET are applied to the bit lines BL00 and BL01 as well as BL80 and BL81 that are selected by the address signals, while the ground voltage (0V) is applied to every other bit line in the group of bit lines BLy<1:0>.

In this way, the column control circuit of this embodiment allows reset voltages VRESET to be applied to the bit lines BL00 and BL01 as well as to BL80 and BL81 in reset operation. These four bit lines BL00 and BL01 as well as BL80 and BL81 are separately arranged within the memory cell array MA as illustrated in FIG. 4. In this embodiment, two column switches 20 are selected by a corresponding column decoder 21 based on a column address signal CA. A group of bit lines BLy<1:0> including two bit lines BL is selectively driven by the column switches 20, which allows voltages VRESET to be applied to the separately-arranged bit lines BL.

Arranging the bit lines BL separately within the memory cell array MA in such the manner allows reduction in the value of voltage drop due to the parasitic resistances PRb and PRw of the bit lines BL and the word line WL in performing reset operation. In particular, this may reduce voltage drop due to the number (N) of memory cells on which reset operations are performed simultaneously and the word line WL.

The resistive memory device according to this embodiment may prevent any drop in reset voltage VRESET to be applied to memory cells MC due to the voltage drop of wiring resistance, even if the number of memory cells to be operated simultaneously increases. The resistive memory device of this embodiment may ensure that reset operations are performed on a large number of memory cells.

[Second Embodiment]

Figure 15:
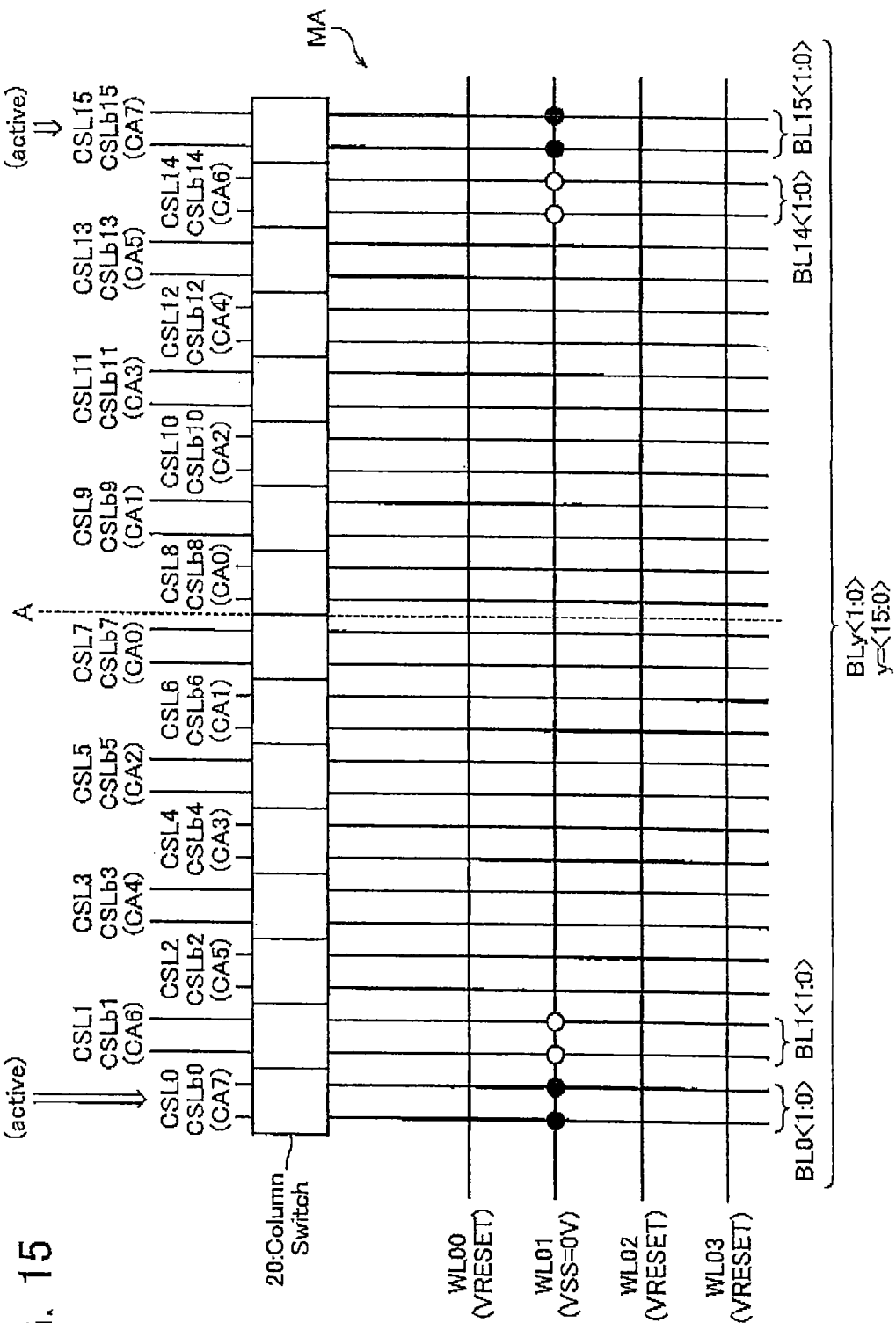
FIG. 15 illustrates respective positions of the memory cells on which reset operations are performed in a resistive memory device according to a second embodiment.

Referring now to FIG. 15, a second embodiment of the resistive memory device according to the present invention will be described below. FIG. 15 illustrates respective positions of memory cells MC in reset operation of the resistive memory device on which reset operations are performed simultaneously in the corresponding memory cell array MA. In FIG. 15, black circles represent those memory cells MC on which reset operations are performed, while white circles represent non-selected memory cells on the same word line WL as the memory cells MC on which the reset operations are performed.

Note that the control circuits in the resistive memory device according to the second embodiment have the same configuration as in the resistive memory device of the first embodiment. In the resistive memory device according to the second embodiment, the same reference numerals represent the same components as the first embodiment and description thereof will be omitted. The resistive memory device according to this embodiment is different from the first embodiment in the arrangement of bit lines BL that are selected by column address signals CA and applied with reset voltages VRESET.

In this embodiment, four bit lines BL specified by either one of column address signals CA7 to CA0 are also separately arranged within the memory cell array MA.

Specifically, the four bit lines BL selectively driven at the same time by one column address signal CA are divided into two sets of two bit lines each. Then, respective sets of bit lines BL, each set including two bit lines BL specified by either one of the column address signals CA7 to CA0, are arranged from one end of the memory cell array MA in accordance with an order of the column address signals. Further, after the last two bit lines BL specified by the column address signal CA0 are arranged, other bit lines BL are arranged so that they exhibit a reflectional symmetry with respect to that arrangement, folded along the symmetry axis A passing through the center of the memory cell array MA and in parallel to the bit lines BL.

In this way, the column address signals CA are set in such a way that the bit lines BL specified by the column address signals CA7 to CA0 are separately arranged within the memory cell array MA.

Reset operations in the resistive memory device so configured will be described below. Four memory cells MC on which reset operations are performed simultaneously are specified by a column address signal CA (e.g., column address signal CA7). The column selection lines CSL0 and CSLb0 as well as CSL15 and CSLb15 are selectively driven by the column address signal CA7, by which the corresponding two column switches 20 are selected. The column switches 20 apply reset voltages VRESET to four bit lines in the groups of bit lines BL0<1:0> and BL15<1:0>. In addition, in reset operation, the selected word line WL01 is driven to a voltage Vss=0V, while non-selected word lines WL00, WL02, and WL03 are driven to voltages VRESET.

The voltages VRESET are applied to the selected memory cells indicated by the black circles in FIG. 15, and reset operations are then performed thereon. On the other hand, no reset voltage VRESET is applied to the bit lines BL of other memory cells indicated by the white circles in FIG. 15 because their corresponding column switches 20 have not been selectively driven by the column selection lines CSL1 and CSLb1 as well as CSL14 and CSLb14. Therefore, no reset operation is performed on the memory cells MC indicated by the white circles. In addition, no reset operation is performed on the other memory cells MC positioned at respective intersections between the other bit lines BL and word lines WL because their corresponding bit lines BL and word lines WL have not also been selectively driven.

Figure 16:
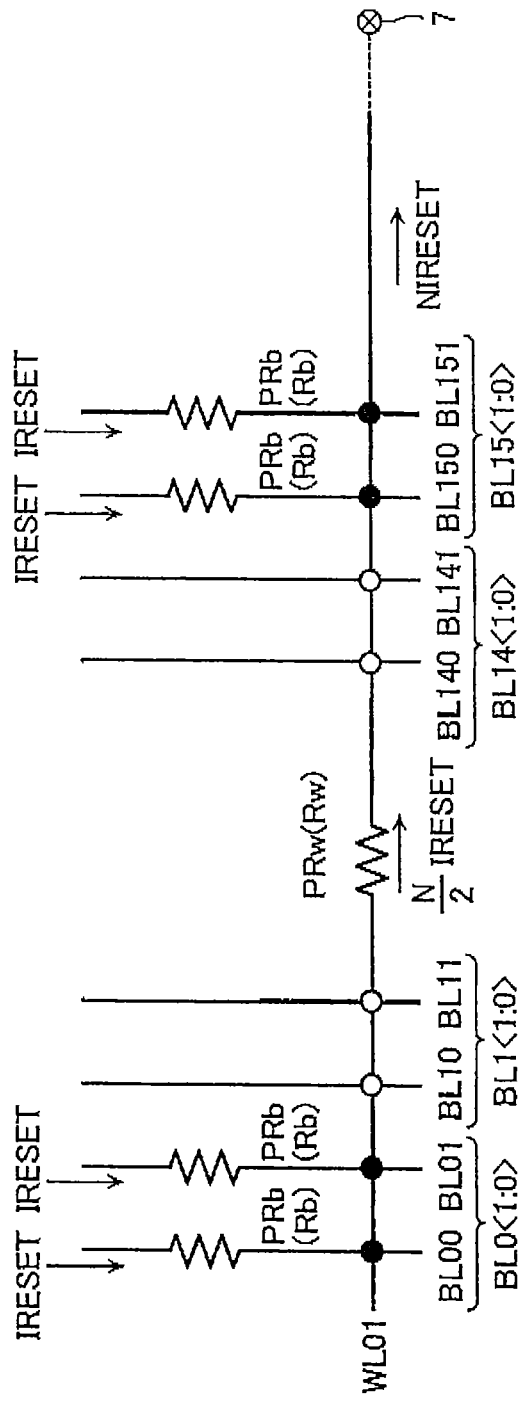
FIG. 16 illustrates parasitic resistances of bit lines and a word line in the resistive memory device according to the second embodiment.

Referring now to FIG. 16, the voltage drop due to respective parasitic resistances PRb and PRw of bit lines BL and a word line WL when the reset operations are performed in this manner will be described below. FIG. 16 illustrates respective parasitic resistances PRb and PRw of bit lines BL and a word line WL in reset operation.

The voltage drop due to the parasitic resistance PRb (resistance value Rb) of a bit line BL is obtained by multiplication of the resistance value Rb and a flowing current IRESET. The voltage drop due to the parasitic resistance PRb of the bit line BL is IRESET*Rb.

In this case, the memory cells MC on which reset operations are performed are separately arranged adjacent to one end of the word line WL, and adjacent to another end of the word line WL. If the memory cells MC on which reset operations are performed are located at one end near the word line contact 7, then very little voltage drop is caused due to the word line WL. The parasitic resistance PRw of the word line WL may be thought of one parasitic resistance PRw (resistance value Rw). In this case, the amount of current is N/2*IRESET since the current flowing through the parasitic resistance PRw is a total of the reset current IRESET flowing through each half of N memory cells MC on which reset operations are performed simultaneously. The voltage drop due to the parasitic resistance PRw (resistance value Rw) of a word line WL is obtained by multiplication of the resistance value Rw and a flowing current N/2*IRESET. The voltage drop due to the parasitic resistance PRw is N/2*IRESET*Rw.

Accordingly, the value of voltage drop in applying reset voltage to a memory cell MC is IRESET*(½*N*Rw+Rb).

If a group of bit lines BLy<1:0> selectively driven by one column address signal CA is adjacently positioned in the memory cell array MA, then the memory cells MC on which reset operations are performed as illustrated in FIG. 3 may be concentrated on one end of the corresponding word line WL. In this case, the value of voltage drop in performing reset operation is IRESET*(N*Rw+Rb).

In contrast, according to the resistive memory device of this embodiment, the bit lines BL specified by one of the column address signals CA7 to CA0 are separately arranged within the memory cell array MA. The value of voltage drop in reset operation on the memory cells MC specified by the column address signal CA7 is IRESET*(½*N*Rw+Rb). In addition, the resistive memory device according to this embodiment may reduce the value of voltage drop in reset operation because the value of voltage drop is substantially equal to IRESET*(½*N*Rw+Rb) whichever column address signal CA7 to CA0 is selected.

In this embodiment, respective four bit lines BL specified by one column address signal CA are also separately arranged within the memory cell array MA. After respective two bit lines BL specified by either one of the column address signals CA7 to CA0 are arranged, other bit lines BL are arranged in a folded manner so that they exhibit a reflectional symmetry with respect to that arrangement. This arrangement of bit lines BL allows reduction in the value of voltage drop due to the parasitic resistances PRb and PRw of the bit lines BL and the word line WL in performing reset operation. In particular, this may reduce voltage drop due to the number (N) of memory cells on which reset operations are performed simultaneously and the word line WL. In addition to this, the value of voltage drop is substantially the same whichever column address signal CA7 to CA0 is selected.

The resistive memory device according to this embodiment may prevent any drop in reset voltage VRESET to be applied to memory cells MC due to the voltage drop of wiring resistance, even if the number of memory cells to be operated simultaneously increases. The resistive memory device of this embodiment may ensure that reset operations are performed on a large number of memory cells.

[Third Embodiment]

Figure 17:
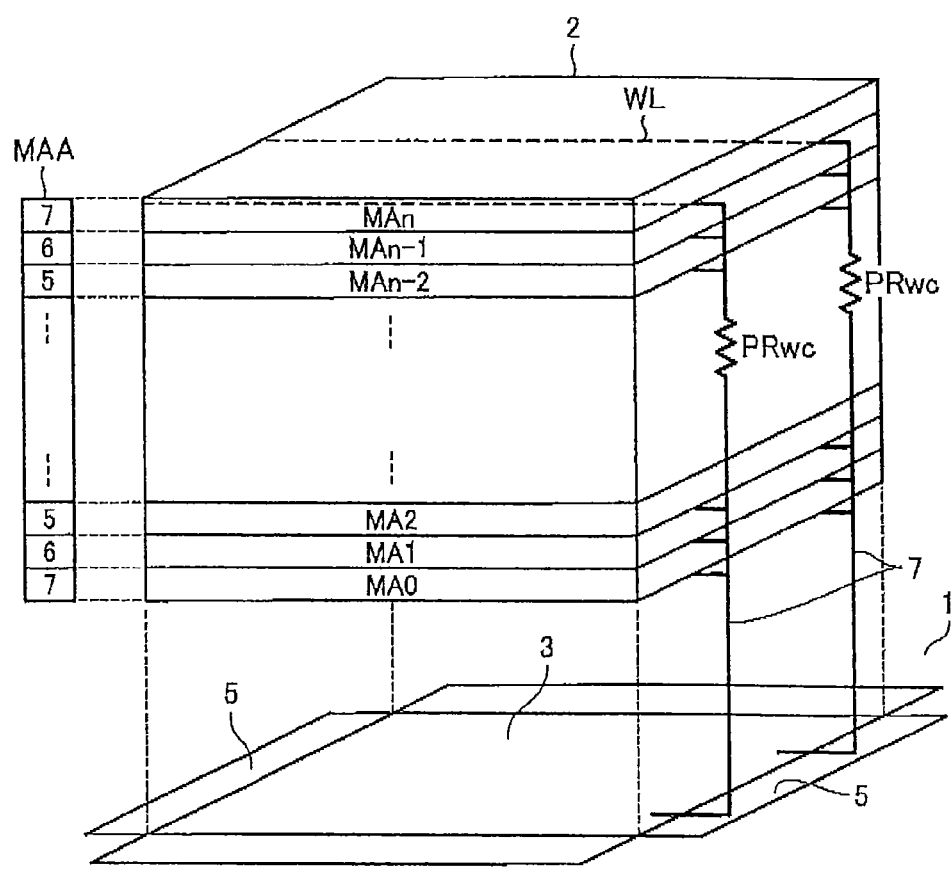
FIG. 17 is a perspective view illustrating respective positions of the memory cell arrays on which reset operations are performed in a resistive memory device according to a third embodiment.

Referring now to FIG. 17, a third embodiment of the resistive memory device according to the present invention will be described below. FIG. 17 illustrates respective positions of the memory cell arrays MA in reset operation of the resistive memory device on which reset operations are performed simultaneously in the memory block 2.

Note that the resistive memory device according to the third embodiment has the same configuration as the resistive memory device according to the first and second embodiments. In the resistive memory device according to the third embodiment, the same reference numerals represent the same components as the first and second embodiments and description thereof will be omitted. The memory cells MC on which reset operations are performed have been described as being located in the memory cell array MA in one layer in the first and second embodiments. The resistive memory device according to the third embodiment is different from the first embodiment in that multiple memory cells MC on which reset operations are performed are provided in multiple memory cell arrays MA in different layers.

The memory cell block 2 illustrated in FIG. 17 has a plurality of memory cell arrays MA0 to MAn laminated thereon in a direction perpendicular to the semiconductor substrate 1. The word lines WL disposed in the plurality of memory cell arrays MA are connected to the wiring region 3 via respective word line contacts 7. In the resistive memory device according to this embodiment, memory cell arrays MA on which reset operations are performed are specified by a memory-cell-array address signal MAA. In this case, consider that there are two layers of memory cell arrays MA on which reset operations are performed simultaneously by a memory-cell-array address signal MAA.

In this embodiment, the two layers of memory cell arrays MA specified by a memory-cell-array address signal MAA are separately arranged within the memory block 2.

Specifically, the two layers of memory cell arrays MA selectively driven at the same time by one memory-cell-array address signal MAA are orderly arranged from top and bottom of the memory block 2, respectively, so that they are symmetrical with respect to the middle layer within one memory block. In this way, the memory-cell-array address signals MAA are set in such a way that the memory cell arrays MA specified by the memory-cell-array address signals MAA are separately arranged within the memory block 2.

Reset operations in the resistive memory device so configured will be described below. Two layers of memory cell arrays MA on which reset operations are performed simultaneously are specified by a memory-cell-array address signal MAA (e.g., memory-cell-array address signal MAA7). According to the memory-cell-array address signal MAA7, reset operations are performed on the memory cells MC in the memory cell arrays MA0 and MAn.

In this case, if both of the two layers of memory cell arrays MA on which reset operations are performed are located at upper levels in the memory block 2 (e.g., memory cell arrays MAn, MAn−1), then a large voltage drop is caused due to parasitic resistances PRwc of word line contacts 7. In this embodiment, however, the memory cell arrays MA on which reset operations are performed are separately arranged within the memory block 2. For example, two layers of memory cell arrays MA0 and MAn specified by the memory-cell-array address signal MAA7 are provided at top and bottom of the memory block 2, respectively. The memory cell array MA0 involves a small voltage drop due to the parasitic resistances PRwc of the word line contacts 7 as it is located near the semiconductor substrate 1. This arrangement of memory cell arrays MA allows reduction in the value of voltage drop due to the parasitic resistances PRwc of the word line contacts 7 in performing reset operation on multiple memory cell arrays MA.

The resistive memory device according to this embodiment may prevent any drop in reset voltage VRESET to be applied to memory cells MC due to the voltage drop of wiring resistance, even if the number of memory cells to be operated simultaneously increases. The resistive memory device of this embodiment may ensure that reset operations are performed on a large number of memory cells.

While embodiments of the present invention have been described, the present invention is not intended to be limited to the disclosed embodiments, and various other changes or additions may be made thereto, or any combinations thereof may be possible without departing from the spirit of the invention. For example, the operation of the resistive memory device has been described as reset operation in the disclosed embodiments. The operation of the resistive memory device may be read operation or setting operation in which the selected memory cell MC changes from a high resistance state to a low resistance state, by adjusting voltage and current applied to the memory cells MC, voltage application time, and so on. In addition, in the disclosed embodiments, a group of bit lines BLy<1:0> includes two wirings and a group of word lines WLx<7:0> includes eight wirings. The number of bit lines BL included in a group of bit lines and the number of word lines WL included in a group of word lines may vary depending on the design of the resistive memory device.

What is claimed is:

1. A semiconductor storage device comprising:
   a memory cell array having memory cells positioned at respective intersections between a plurality of first wirings and a plurality of second wirings, each of the memory cells having a variable resistance element; and
   a control circuit selectively driving the first and second wirings,
   in applying, by the control circuit, a certain potential difference to a selected memory cell positioned at an intersection between the first and second wirings,
   the plurality of first wirings specified and selectively driven at the same time by one of a plurality of address signals being separately arranged with other first wirings interposed therebetween within the memory cell array,
   the first wirings being arranged such that a first set of the plurality of first wirings specified and selectively driven at the same time by a first address signal are positioned apart from a second set of the plurality of first wirings specified and selectively driven at the same time by the first address signal, with other first wirings interposed between the first and second set in the memory cell array, and
   a plurality of sets of the first wirings being repeatedly arranged in the memory cell array, each of the first wirings in one of the plurality of sets being specified by different ones of the address signals.

2. The semiconductor storage device according to claim 1, wherein
   the first wirings are arranged such that a first set of the plurality of first wirings specified and selectively driven at the same time by a first address signal are positioned apart from a second set of the plurality of first wirings specified and selectively driven at the same time by the first address signal, with other first wirings interposed between the first and second set in the memory cell array.

3. The semiconductor storage device according to claim 1, further comprising:
   a memory block having a plurality of the memory cell arrays laminated thereon in a direction perpendicular to a semiconductor substrate,
   wherein a plurality of the memory cell arrays specified and selectively driven at the same time by one memory-cell-array address signal are separately arranged with other memory cell arrays interposed therebetween within the memory block.

4. The semiconductor storage device according to claim 1, wherein
   the control circuit comprises:
      a column switch connected to the plurality of first wirings and selectively driving the first wirings; and
      a column selection line connected to the column switch;
   a first set of the plurality of first wirings specified and selectively driven at the same time by a first address signal and a second set of the plurality of first wirings specified and selectively driven at the same time by the first address signal are connected to different column switches.

5. The semiconductor storage device according to claim 1, wherein
   the control circuit comprises:
      a column switch connected to the plurality of first wirings and selectively driving the first wirings;
      a column selection line connected to the column switch; and
      a column decoder selectively driving the column selection line according to the address signals; and
   the control circuit has a hierarchical structure, selectively driving the first wirings by the column decoder and the column switch.

6. A semiconductor storage device comprising:
   a memory cell array having memory cells positioned at respective intersections between a plurality of first wirings and a plurality of second wirings, each of the memory cells having a variable resistance element; and
   a control circuit selectively driving the first and second wirings,
   in applying, by the control circuit, a first voltage to the first wirings and a second voltage lower than the first voltage to the second wirings to apply a certain potential difference to a selected memory cell positioned at an intersection between the first and second wirings,
   the plurality of first wirings specified and selectively driven at the same time by one of a plurality of address signals being separately arranged with other first wirings interposed therebetween within the memory cell array,
   the first wirings being arranged such that a first set of the plurality of first wirings specified and selectively driven at the same time by a first address signal are positioned apart from a second set of the plurality of first wirings specified and selectively driven at the same time by the first address signal, with other first wirings interposed between the first and second set in the memory cell array, and a plurality of sets of the first wirings being repeatedly arranged in the memory cell array, each of the first wirings in one of the plurality of sets being specified by different ones of the address signals.

7. The semiconductor storage device according to claim 6, wherein the first wirings are arranged such that a first set of the plurality of first wirings specified and selectively driven at the same time by a first address signal are positioned apart from a second set of the plurality of first wirings specified and selectively driven at the same time by the first address signal, with other first wirings interposed between the first and second set in the memory cell array.

8. The semiconductor storage device according to claim 6, further comprising:

a memory block having a plurality of the memory cell arrays laminated thereon in a direction perpendicular to a semiconductor substrate, wherein a plurality of the memory cell arrays specified and selectively driven at the same time by one memory-cell-array address signal are separately arranged with other memory cell arrays interposed therebetween within the memory block.

9. The semiconductor storage device according to claim 6, wherein the control circuit comprises:
a column switch connected to the plurality of first wirings and selectively driving the first wirings; and
a column selection line connected to the column switch; and a first set of the plurality of first wirings specified and selectively driven at the same time by a first address signal and a second set of the plurality of first wirings specified and selectively driven at the same time by the first address signal are connected to different column switches.

10. The semiconductor storage device according to claim 6, wherein the control circuit comprises:
a column switch connected to the plurality of first wirings and selectively driving the first wirings;
a column selection line connected to the column switch; and
a column decoder selectively driving the column selection line according to the address signals; and
the control circuit has a hierarchical structure, selectively driving the first wirings by the column decoder and the column switch.

11. A semiconductor storage device comprising:

a memory cell array having memory cells positioned at respective intersections between a plurality of first wirings and a plurality of second wirings, each of the memory cells having a variable resistance element; and a control circuit selectively driving the first and second wirings, in applying, by the control circuit, a certain potential difference to a selected memory cell positioned at an intersection between multiple ones of the first wirings and one of the second wirings, the plurality of memory cells connected to one of the second wirings, on which memory cells operations are performed simultaneously, being separately arranged with other memory cells interposed therebetween in a direction in which the second wiring extends, the memory cells being arranged such that a first set of the plurality of memory cells specified and performed operation at the same time by a first address signal are positioned apart from a second set of the plurality of memory cells specified and performed operation at the same time by the first address signal, with other memory cells interposed between the first and second set in the memory cell array, and a plurality of sets of the memory cells being repeatedly arranged in the memory cell array, each of the memory cells in one of the plurality of sets being specified by different ones of address signals.

12. The semiconductor storage device according to claim 11, wherein the memory cells are arranged such that a first set of the plurality of memory cells specified and performed operation at the same time by a first address signal are positioned apart from a second set of the plurality of memory cells specified and performed operation at the same time by the first address signal, with other memory cells interposed between the first and second set in the memory cell array.

13. The semiconductor storage device according to claim 11, wherein the control circuit comprises:
a column switch connected to the plurality of first wirings and selectively driving the first wirings; and
a column selection line connected to the column switch; and a first set of the plurality of memory cells specified and performed operation at the same time by a first address signal and a second set of the plurality of memory cells specified and performed operation at the same time by the first address signal are operated by the first wirings connected to different column switches.

14. The semiconductor storage device according to claim 11, wherein the control circuit comprises:
a column switch connected to the plurality of first wirings and selectively driving the first wirings;
a column selection line connected to the column switch; and
a column decoder selectively driving the column selection line according to the address signals; and
the control circuit has a hierarchical structure, selectively driving the first wirings by the column decoder and the column switch.

15. A semiconductor storage device comprising:

a memory cell array having memory cells positioned at respective intersections between a plurality of first wirings and a plurality of second wirings each of the memory cells having a variable resistance element; and a control circuit selectively driving the first and second wirings, in applying, by the control circuit, a certain potential difference to a selected memory cell positioned at an intersection between the first and second wirings, the plurality of first wirings specified and selectively driven at the same time by one of a plurality of address signals being separately arranged with other first wirings interposed therebetween within the memory cell array, the first wirings being arranged such that a first set of the plurality of first wirings specified and selectively driven at the same time by a first address signal and a second set of the plurality of first wirings specified and selectively driven at the same time by the first address signal are arranged in the memory cell array so that they exhibit a reflectional symmetry with respect to a line of symmetry axis passing through the center of the memory cell array and in parallel to the first wirings.

16. The semiconductor storage device according to claim 15, wherein
the first wirings are arranged such that a first set of the plurality of first wirings specified and selectively driven at the same time by a first address signal are positioned apart from a second set of the plurality of first wirings specified and selectively driven at the same time by the first address signal, with other first wirings interposed between the first and second set in the memory cell array.

17. The semiconductor storage device according to claim 15, further comprising:
a memory block having a plurality of the memory cell arrays laminated thereon in a direction perpendicular to a semiconductor substrate,
wherein a plurality of the memory cell arrays specified and selectively driven at the same time by one memory-cell-array address signal are separately arranged with other memory cell arrays interposed therebetween within the memory block.

18. The semiconductor storage device according to claim 15, wherein
the control circuit comprises:
a column switch connected to the plurality of first wirings and selectively driving the first wirings; and
a column selection line connected to the column switch;
a first set of the plurality of first wirings specified and selectively driven at the same time by a first address signal and a second set of the plurality of first wirings specified and selectively driven at the same time by the first address signal are connected to different column switches.

19. The semiconductor storage device according to claim 15, wherein
the control circuit comprises:
a column switch connected to the plurality of first wirings and selectively driving the first wirings;
a column selection line connected to the column switch; and
a column decoder selectively driving the column selection line according to the address signals; and
the control circuit has a hierarchical structure, selectively driving the first wirings by the column decoder and the column switch.

20. A semiconductor storage device comprising:
a memory cell array having memory cells positioned at respective intersections between a plurality of first wirings and a plurality of second wirings, each of the memory cells having a variable resistance element; and
a control circuit selectively driving the first and second wirings,
in applying, by the control circuit, a first voltage to the first wirings and a second voltage lower than the first voltage to the second wirings to apply a certain potential difference to a selected memory cell positioned at an intersection between the first and second wirings,
the plurality of first wirings specified and selectively driven at the same time by one of a plurality of address signals being separately arranged with other first wirings interposed therebetween within the memory cell array,
the first wirings being arranged such that a first set of the plurality of first wirings specified and selectively driven at the same time by a first address signal and a second set of the plurality of first wirings specified and selectively driven at the same time by the first address signal are arranged in the memory cell array so that they exhibit a reflectional symmetry with respect to a line of symmetry axis passing through the center of the memory cell array and in parallel to the first wirings.

21. The semiconductor storage device according to claim 20, wherein
the first wirings are arranged such that a first set of the plurality of first wirings specified and selectively driven at the same time by a first address signal are positioned apart from a second set of the plurality of first wirings specified and selectively driven at the same time by the first address signal, with other first wirings interposed between the first and second set in the memory cell array.

22. The semiconductor storage device according to claim 20, further comprising:
a memory block having a plurality of the memory cell arrays laminated thereon in a direction perpendicular to a semiconductor substrate,
wherein a plurality of the memory cell arrays specified and selectively driven at the same time by one memory-cell-array address signal are separately arranged with other memory cell arrays interposed therebetween within the memory block.

23. The semiconductor storage device according to claim 20, wherein
the control circuit comprises:
a column switch connected to the plurality of first wirings and selectively driving the first wirings; and
a column selection line connected to the column switch; and
a first set of the plurality of first wirings specified and selectively driven at the same time by a first address signal and a second set of the plurality of first wirings specified and selectively driven at the same time by the first address signal are connected to different column switches.

24. The semiconductor storage device according to claim 20, wherein
the control circuit comprises:
a column switch connected to the plurality of first wirings and selectively driving the first wirings;
a column selection line connected to the column switch; and
a column decoder selectively driving the column selection line according to the address signals; and
the control circuit has a hierarchical structure, selectively driving the first wirings by the column decoder and the column switch.

25. A semiconductor storage device comprising:
a memory cell array having memory cells positioned at respective intersections between a plurality of first wirings and a plurality of second wirings, each of the memory cells having a variable resistance element; and
a control circuit selectively driving the first and second wirings,
in applying, by the control circuit, a certain potential difference to a selected memory cell positioned at an intersection between multiple ones of the first wirings and one of the second wirings,
the plurality of memory cells connected to one of the second wirings, on which memory cells operations are performed simultaneously, being separately arranged with other memory cells interposed therebetween in a direction in which the second wiring extends,
the memory cells being arranged such that a first set of the plurality of memory cells specified and performed operation at the same time by a first address signal and a second set of the plurality of memory cells specified and performed operation at the same time by the first address signal are arranged in the memory cell array so that they exhibit a reflectional symmetry with respect to a line of symmetry axis passing through the center of the memory cell array and in parallel to the first wirings.

26. The semiconductor storage device according to claim 25, wherein
the memory cells are arranged such that a first set of the plurality of memory cells specified and performed operation at the same time by a first address signal are positioned apart from a second set of the plurality of memory cells specified and performed operation at the same time by the first address signal, with other memory cells interposed between the first and second set in the memory cell array.

27. The semiconductor storage device according to claim 25, wherein
the control circuit comprises:
a column switch connected to the plurality of first wirings and selectively driving the first wirings; and
a column selection line connected to the column switch; and
a first set of the plurality of memory cells specified and performed operation at the same time by a first address signal and a second set of the plurality of memory cells specified and performed operation at the same time by the first address signal are operated by the first wirings connected to different column switches.

28. The semiconductor storage device according to claim 25, wherein
the control circuit comprises:
a column switch connected to the plurality of first wirings and selectively driving the first wirings;
a column selection line connected to the column switch; and
a column decoder selectively driving the column selection line according to the address signals; and
the control circuit has a hierarchical structure, selectively driving the first wirings by the column decoder and the column switch.

* * * * *